US012652490B2

(12) United States Patent (10) Patent No.: US 12,652,490 B2
Hashiguchi (45) Date of Patent: Jun. 9, 2026

(54) IMAGE CAPTURE APPARATUS AND CONTROL METHOD

(71) Applicant: CANON KABUSHIKI KAISHA, Tokyo (JP)

(72) Inventor: Aoi Hashiguchi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 200 days.

(21) Appl. No.: 18/438,883

(22) Filed: Feb. 12, 2024

(65) Prior Publication Data

US 2024/0276146 A1 Aug. 15, 2024

(30) Foreign Application Priority Data

Feb. 15, 2023 (JP) ................................. 2023-021864

(51) Int. Cl.
H04R 3/00 (2006.01)
H03G 3/32 (2006.01)
(52) U.S. Cl.
CPC .............. H04R 3/005 (2013.01); H03G 3/32 (2013.01); H04R 2430/20 (2013.01)
(58) Field of Classification Search
CPC ..... H04R 3/005; H04R 2430/20; H04S 3/002; H04S 2400/03
USPC ......................... 381/56, 58, 91, 92, 124, 385
See application file for complete search history.

(56) References Cited

U.S. PATENT DOCUMENTS

| | | | |
|---|---|---|---|
| 9,363,596 B2 | 6/2016 | Dusan | |
| 2010/0158267 A1* | 6/2010 | Thormundsson | ...... H04R 3/005 381/92 |
| 2015/0172807 A1* | 6/2015 | Olsson | ................ G10L 21/0208 381/74 |
| 2019/0250245 A1* | 8/2019 | Koyama | ................ H04R 3/005 |
| 2023/0329913 A1* | 10/2023 | Li | ........................... G10L 15/22 |
| 2024/0032864 A1* | 2/2024 | Mulumudi | ............. A61B 5/744 |

FOREIGN PATENT DOCUMENTS

| | | |
|---|---|---|
| JP | 2009049947 A | 3/2009 |
| JP | 4931907 B2 | 5/2012 |
| JP | 2019054440 A | 4/2019 |

* cited by examiner

*Primary Examiner* — William A Jerez Lora
(74) *Attorney, Agent, or Firm* — Cowan, Liebowitz & Latman, P.C.

(57) ABSTRACT

An image capture apparatus that is wearable on a neck of a user, comprises first to fourth microphones provided on the mount portion, and a sound processing unit. The first and second microphones are provided at positions for collecting sound on a left side of the user who is wearing the image capture apparatus. The third and fourth microphones are provided at positions for collecting sound on a right side of the user who is wearing the image capture apparatus. The sound processing unit generates a first sound signal having a directivity for the left ear of the user, based on sound signals obtained by the first and second microphones, and generates a second sound signal having a directivity for the right ear of the user, based on sound signals obtained by the third and fourth microphones.

7 Claims, 18 Drawing Sheets

F I G. 1B
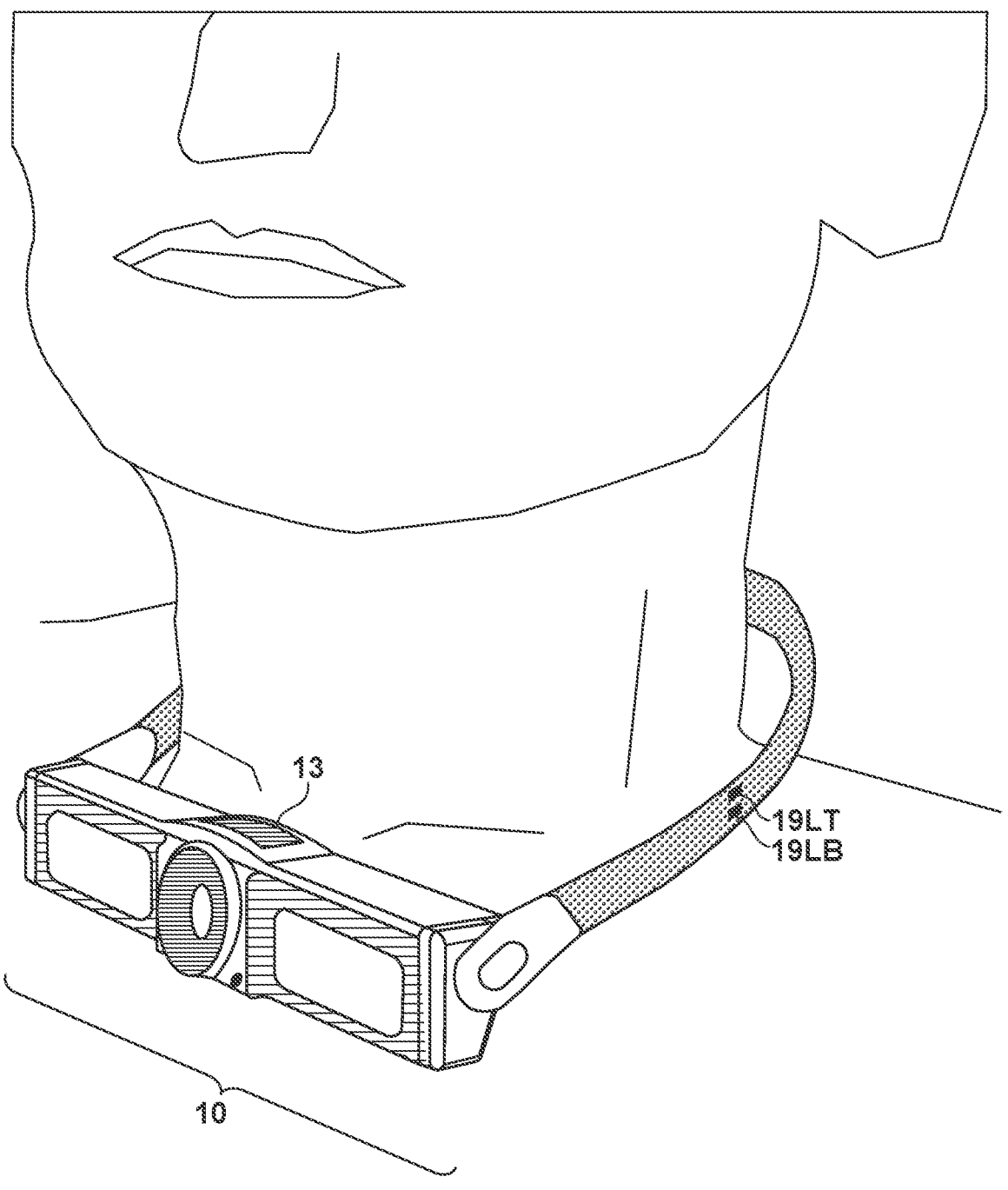

F I G. 1C
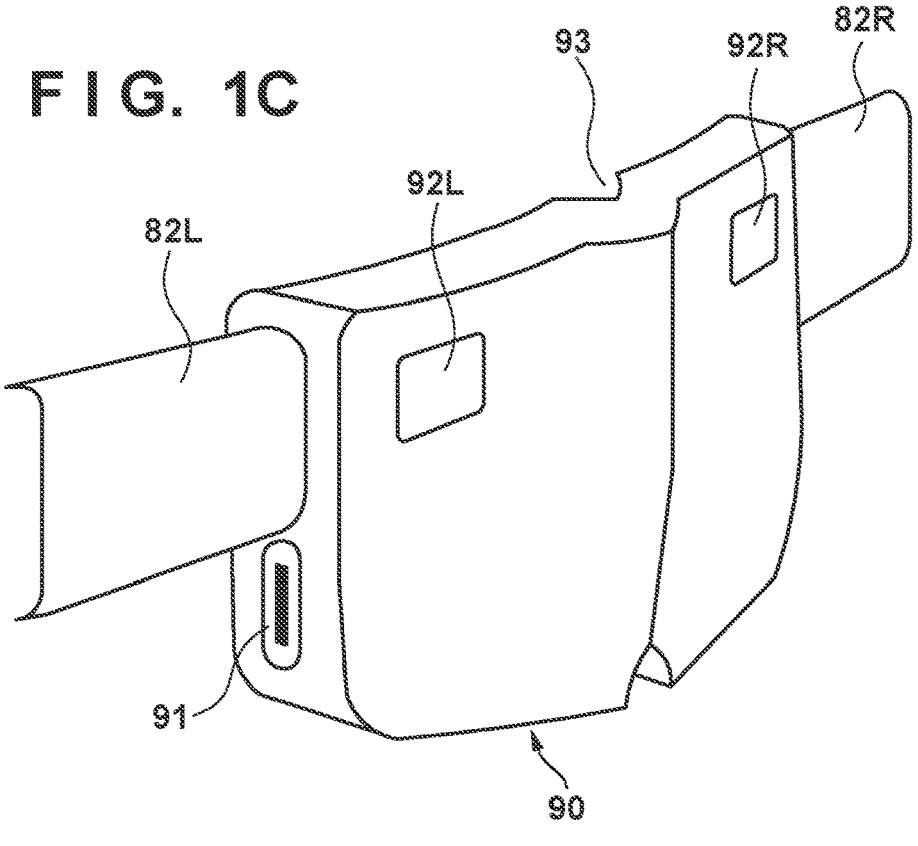
F I G. 1D
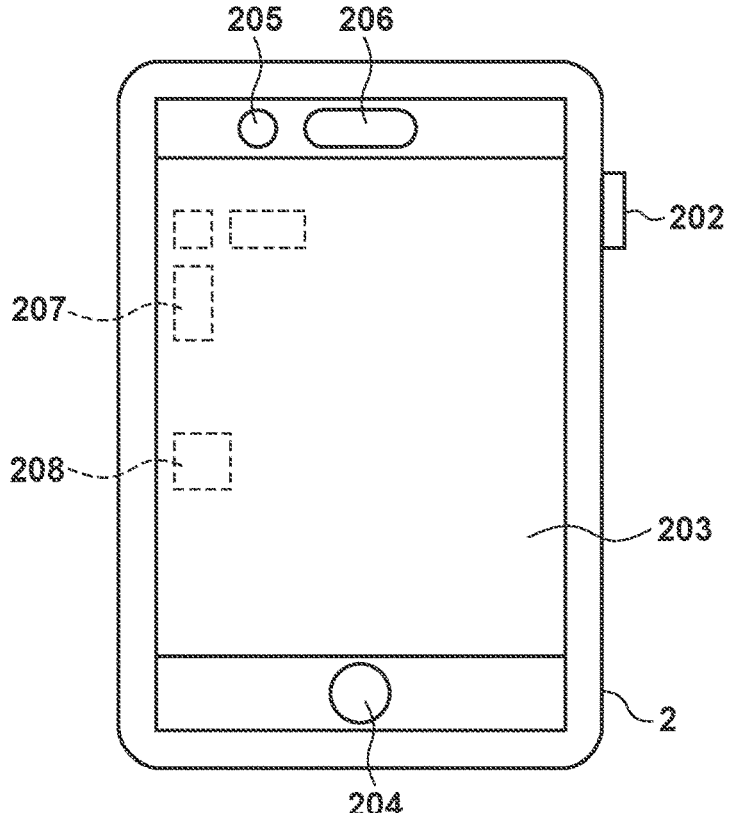

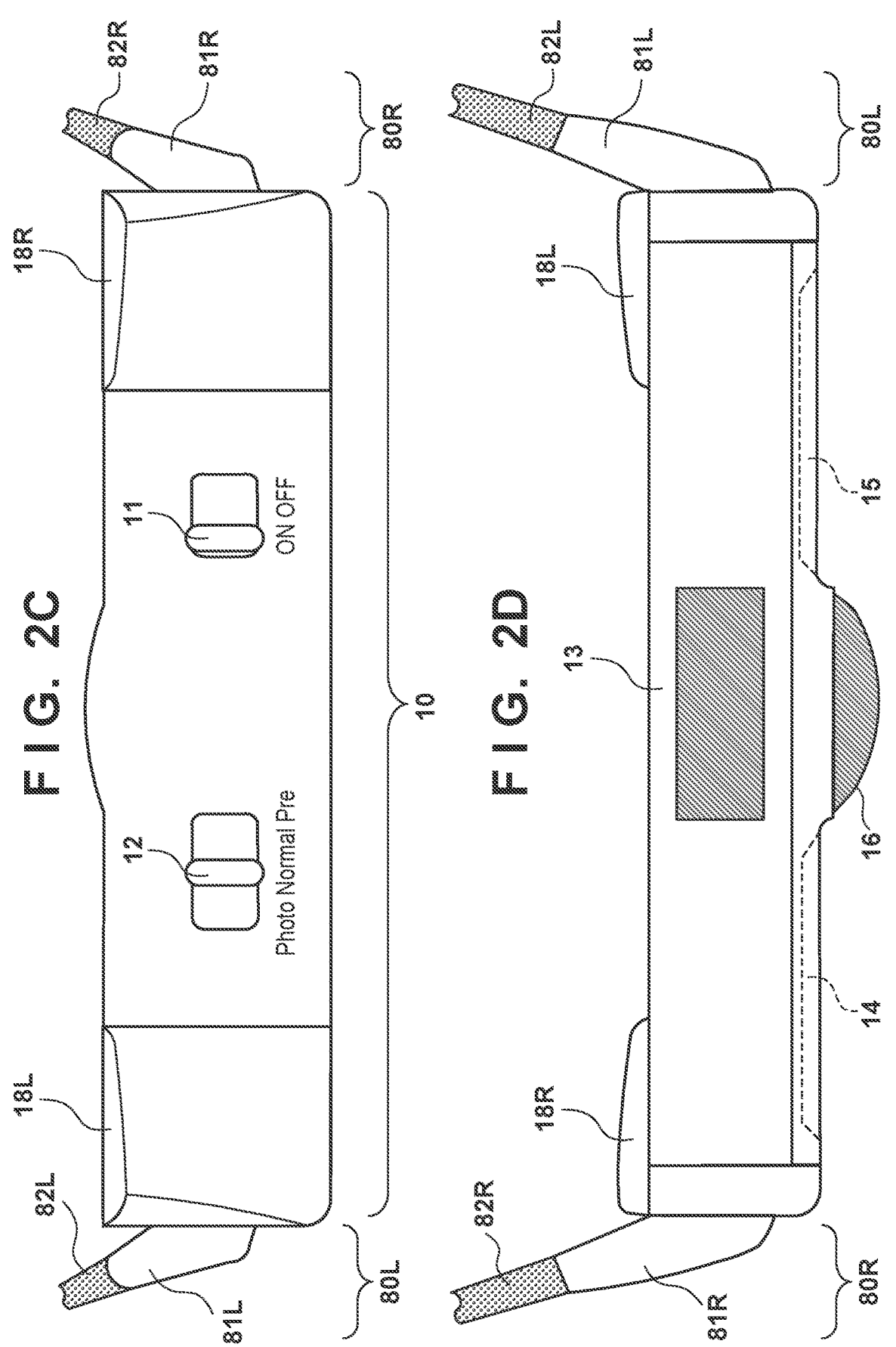

F I G. 3A
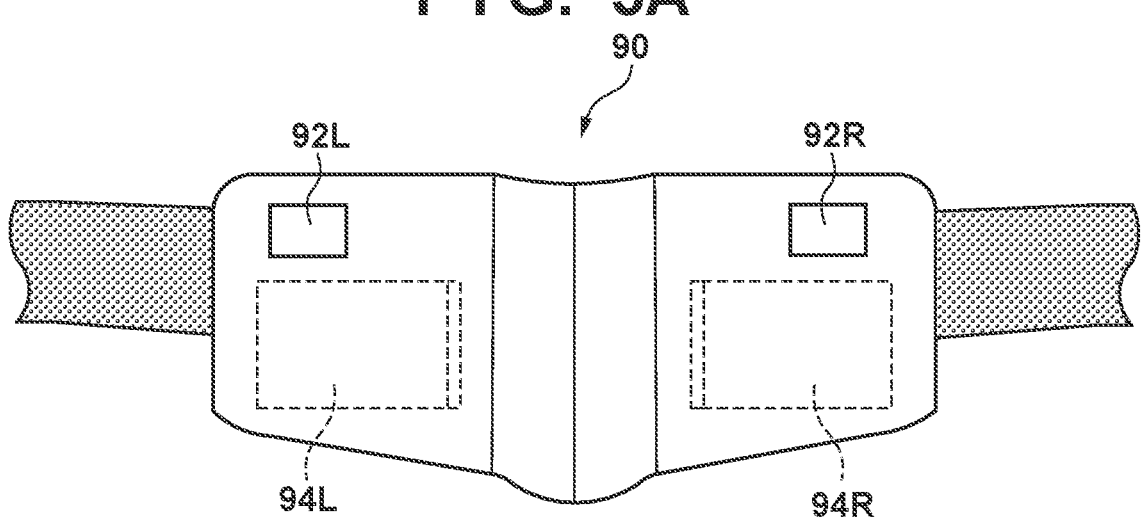
F I G. 3B
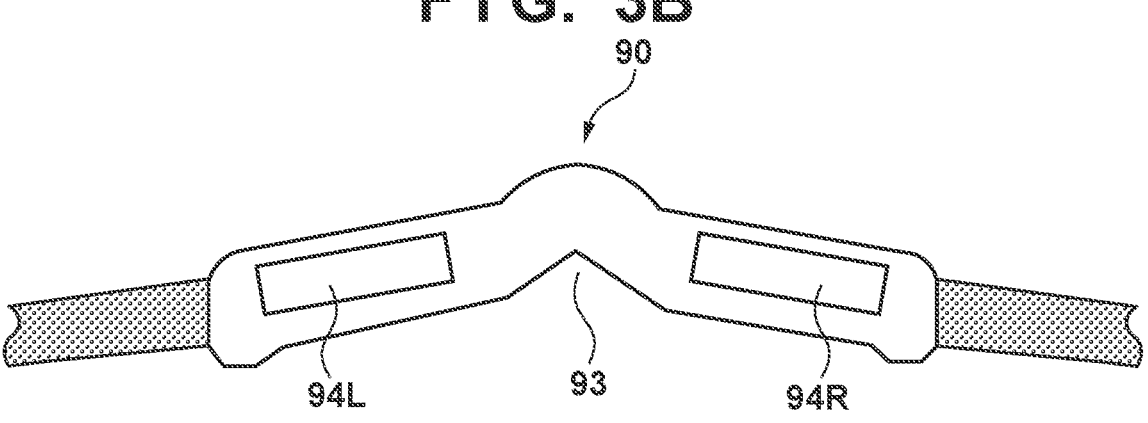
F I G. 3C
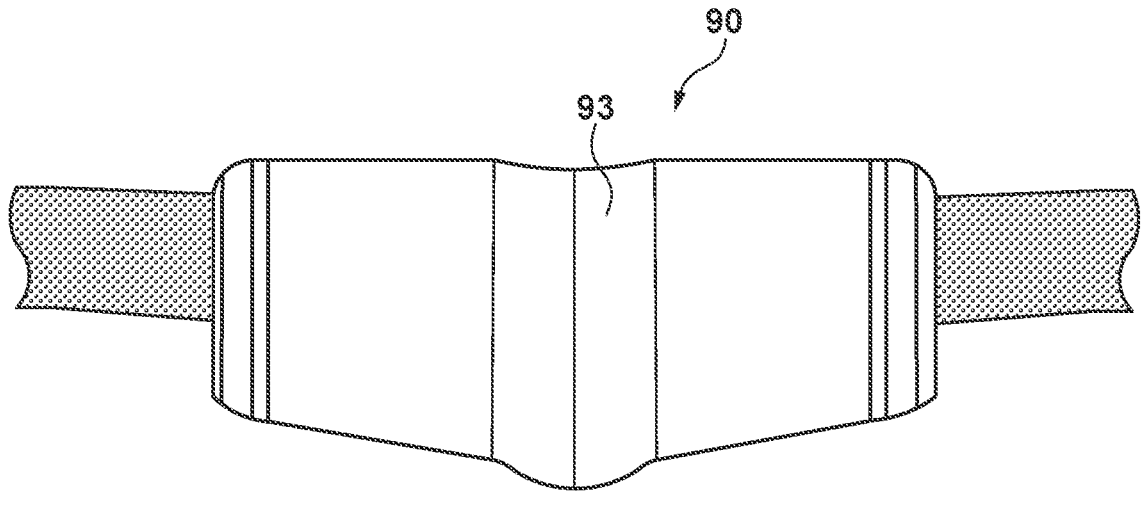

F I G. 4

F I G. 5
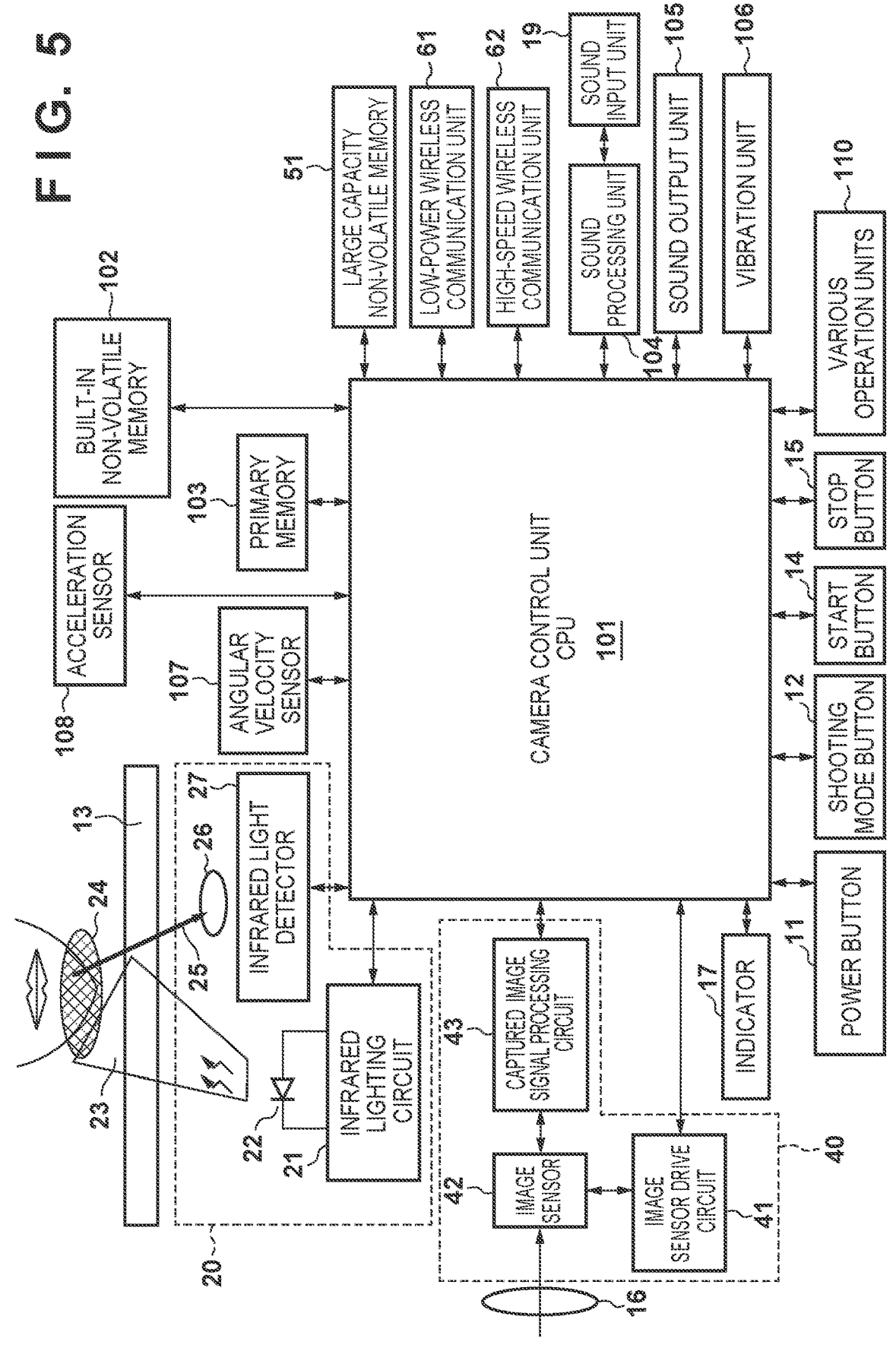

F I G. 6
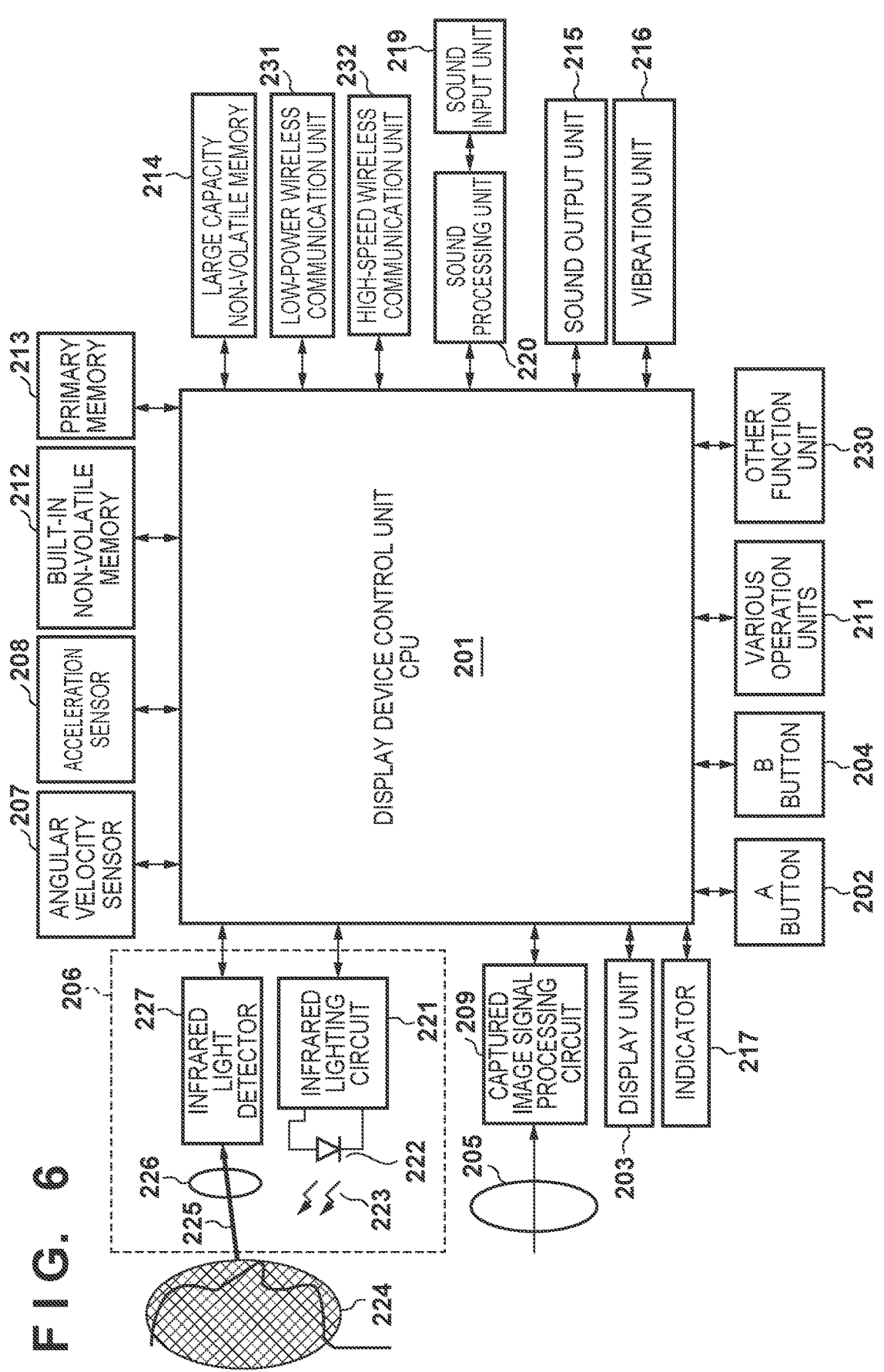

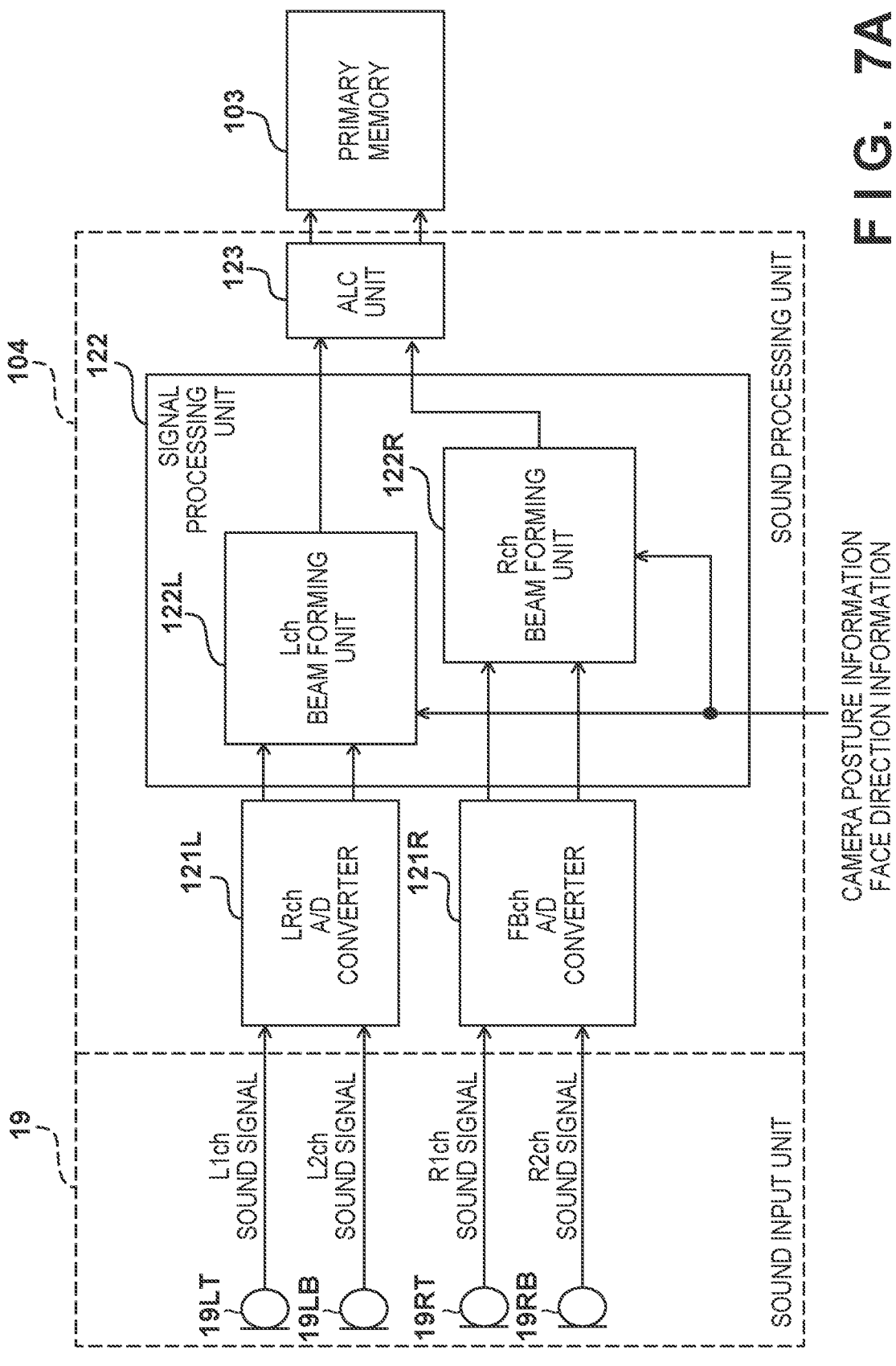
F I G. 7A

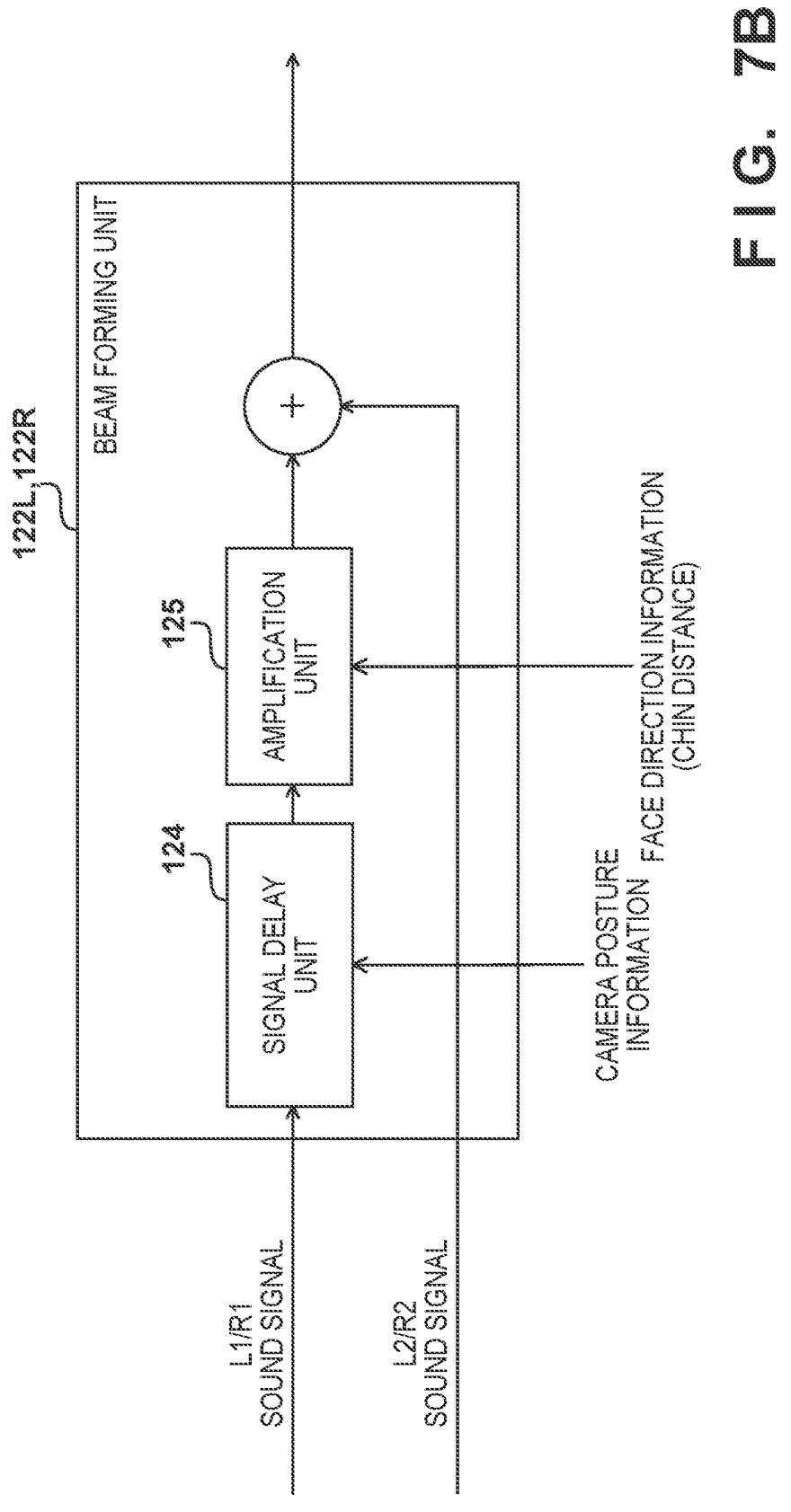
F I G. 7B

F I G.  8A

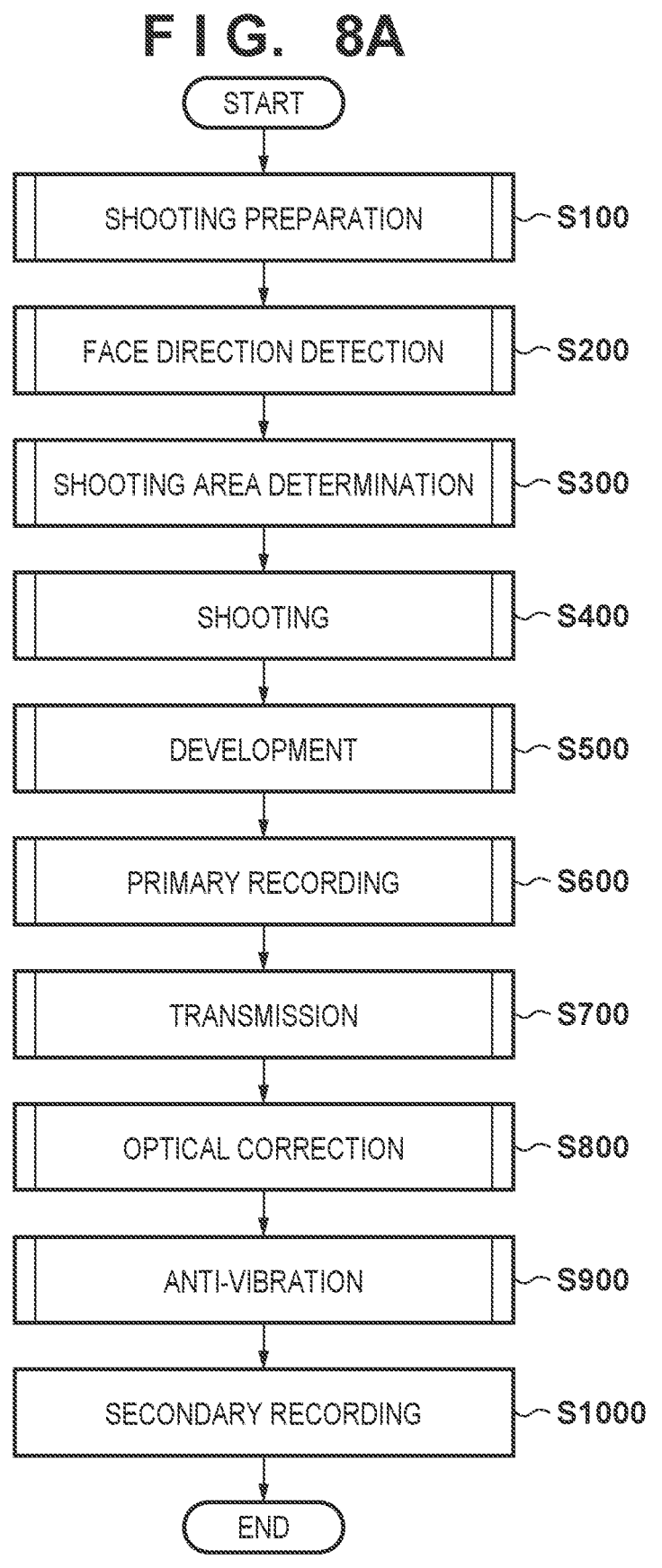

START

SHOOTING PREPARATION — S100

FACE DIRECTION DETECTION — S200

SHOOTING AREA DETERMINATION — S300

SHOOTING — S400

DEVELOPMENT — S500

PRIMARY RECORDING — S600

TRANSMISSION — S700

OPTICAL CORRECTION — S800

ANTI-VIBRATION — S900

SECONDARY RECORDING — S1000

END

F I G. 8B
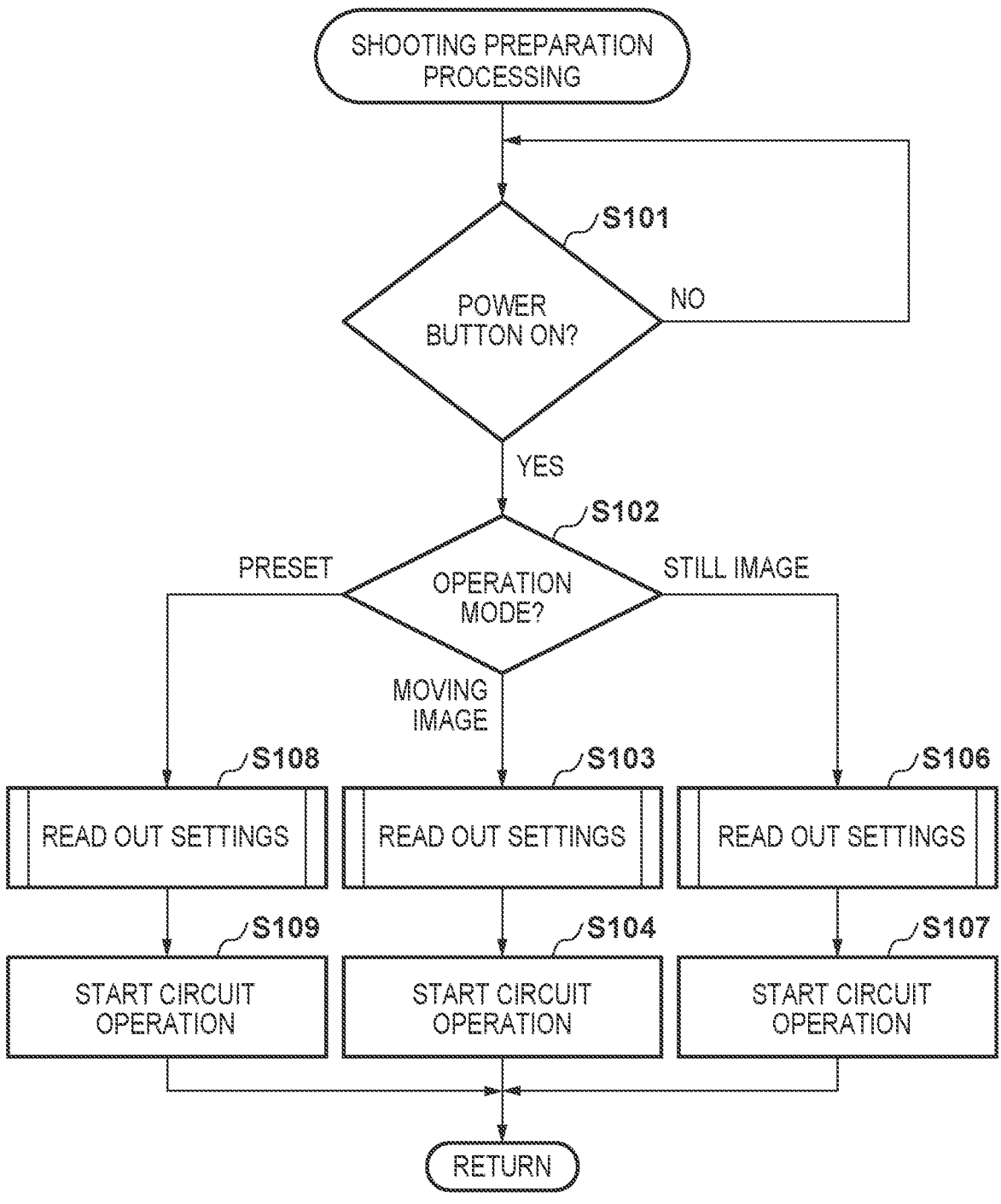

F I G.  8D
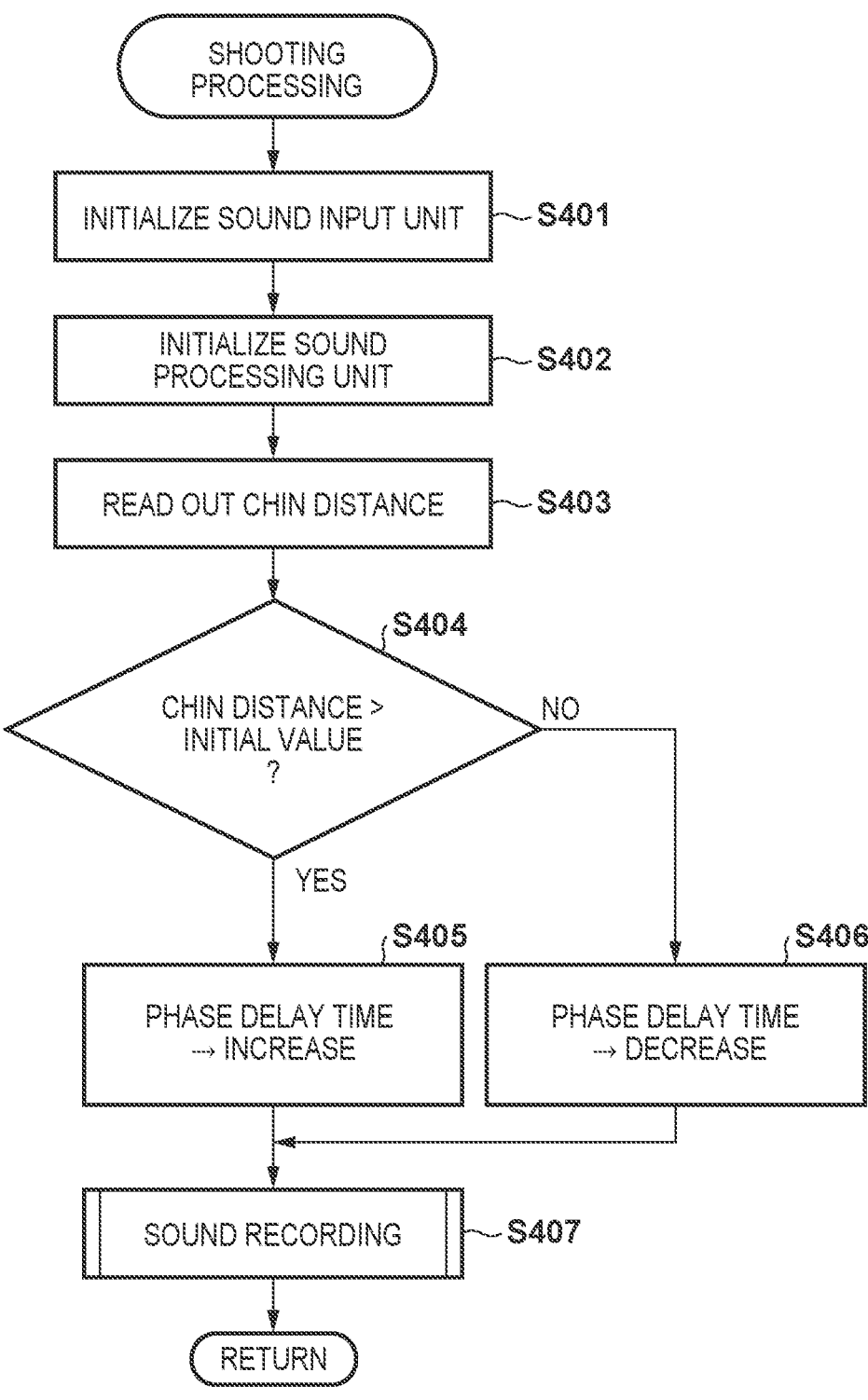

F I G. 9C

207

F

θv 13

10

F I G. 10

1001

1002

10

19LB,19RB 19LT,19RT

IMAGE CAPTURE APPARATUS AND CONTROL METHOD

BACKGROUND OF THE INVENTION

Field of the Invention

The present invention relates to an image capture apparatus that is wearable on the body of a user.

Description of the Related Art

There are known wearable cameras capable of performing shooting while being worn on the bodies of users, so as to enable activities of the users to be recorded. In addition, a technique called binaural recording is known as a method for recording sound that has a realistic sensation (Japanese Patent Laid-Open No. 2019-54440). In binaural recording, sound is recorded by two microphones attached to the ears of a person. When listening to sound recorded through binaural recording, using headphones, the user can listen to sound with a realistic sensation that makes the user feel like he or she is at a recording site.

When the user performs binaural recording in a state where the user is wearing a wearable camera, it is desirable the wearable camera can be worn on the user without a microphone being conspicuous. In this case, when the microphone is disposed at a position distant from the ears of the user due to a form for wearing the microphone or physical differences of users, there are cases where effects of binaural recording cannot be achieved.

SUMMARY OF THE INVENTION

The present invention has been made in consideration of the aforementioned problems, and realized techniques for achieving the effect of binaural recording irrespective of a change in the distance between a microphone and an ear of a user.

In order to solve the aforementioned problems, the present invention provides an image capture apparatus that is wearable on a neck of a user, comprising: an image capture circuit; a mount portion that is disposed so as to surround the neck of the user when the image capture apparatus is worn on the user; a first microphone, a second microphone, a third microphone, and a fourth microphone provided on the mount portion, the first microphone and the second microphone being provided at positions for collecting sound on a left side of the user who is wearing the image capture apparatus, the first microphone being provided at a position closer to the left ear of the user who is wearing the image capture apparatus than the second microphone is, the third microphone and the fourth microphone being provided at positions for collecting sound on a right side of the user who is wearing the image capture apparatus, and the third microphone being provided at a position closer to the right ear of the user who is wearing the image capture apparatus than the fourth microphone is; a CPU; and a memory that stores a program for causing, when executed by the CPU, the CPU to function as: a sound processing unit that generates a first sound signal having a directivity for the left ear of the user, based on sound signals obtained by the first microphone and the second microphone, and that generates a second sound signal having a directivity for the right ear of the user, based on sound signals obtained by the third microphone and the fourth microphone.

In order to solve the aforementioned problems, the present invention provides a method of controlling an image capture apparatus that is wearable on a neck of a user, wherein the image capture apparatus includes: an image capture circuit, a mount portion that is disposed so as to surround the neck of the user when the image capture apparatus is worn on the user, a first microphone, a second microphone, a third microphone, and a fourth microphone provided on the mount portion, the first microphone and the second microphone being provided at positions for collecting sound on a left side of the user who is wearing the image capture apparatus, the first microphone being provided at a position closer to the left ear of the user who is wearing the image capture apparatus than the second microphone is, the third microphone and the fourth microphone being provided at positions for collecting sound on a right side of the user who is wearing the image capture apparatus, and the third microphone being provided at a position closer to the right ear of the user who is wearing the image capture apparatus than the fourth microphone is, and a sound processing unit, wherein the method includes: generating a first sound signal having a directivity for the left ear of the user, based on sound signals obtained by the first microphone and the second microphone, and generating a second sound signal having a directivity for the right ear of the user, based on sound signals obtained by the third microphone and the fourth microphone.

According to the present invention, the effect of binaural recording can be achieved irrespective of a change in the distance between an ear of a user and a microphone.

Further features of the present invention will become apparent from the following description of exemplary embodiments (with reference to the attached drawings).

BRIEF DESCRIPTION OF THE DRAWINGS

FIG. 1B is a diagram showing a state where the wearable camera according to the present embodiment is worn.

FIG. 1C is a diagram of a battery portion of the wearable camera according to the present embodiment as viewed from the rear side of FIG. 1A.

FIG. 1D is an external view of a display device according to the present embodiment.

FIG. 2C is a rear view of the camera body of the wearable camera according to the present embodiment.

FIG. 2D is a top view of the camera body of the wearable camera according to the present embodiment.

FIG. 3A is a rear view of the battery portion of the wearable camera according to the present embodiment.

FIG. 3B is a top view of the battery portion of the wearable camera according to the present embodiment.

FIG. 3C is a front view of the battery portion of the wearable camera according to the present embodiment.

FIG. 4 is a block diagram showing a functional configuration of the wearable camera according to the present embodiment.

FIG. 5 is a block diagram showing a hardware configuration of the wearable camera according to the present embodiment.

FIG. 6 is a block diagram showing a hardware configuration of the display device according to the present embodiment.

FIG. 7A is a block diagram showing a configuration of a sound processing unit of the wearable camera according to the present embodiment.

FIG. 7B is a block diagram showing a configuration of a beam forming unit of the sound processing unit in FIG. 7A.

FIG. 8A is a flowchart showing control processing of the wearable camera and the display device according to the present embodiment.

FIG. 8B is a flowchart showing the shooting preparation processing in FIG. 8A.

FIG. 8D is a flowchart showing recording processing in the shooting processing in FIG. 8A.

FIG. 9C is a diagram illustrating the face direction detection method of the wearable camera of the present embodiment.

FIG. 10 is a diagram illustrating beam forming processing of the wearable camera according to the present embodiment.

DESCRIPTION OF THE EMBODIMENTS

Figure 1A:
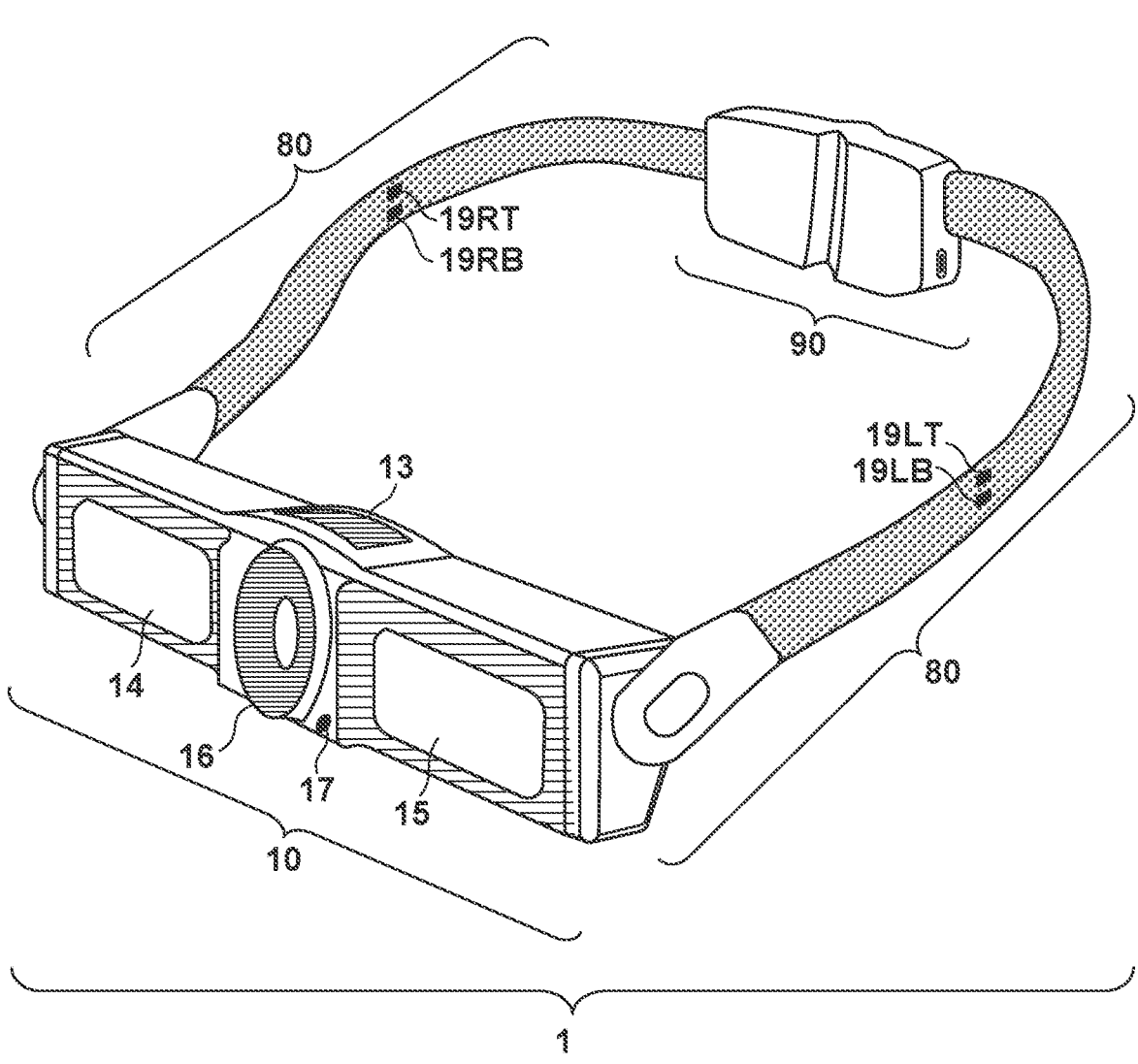
FIG. 1A is an external view of a wearable camera according to the present embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 4:
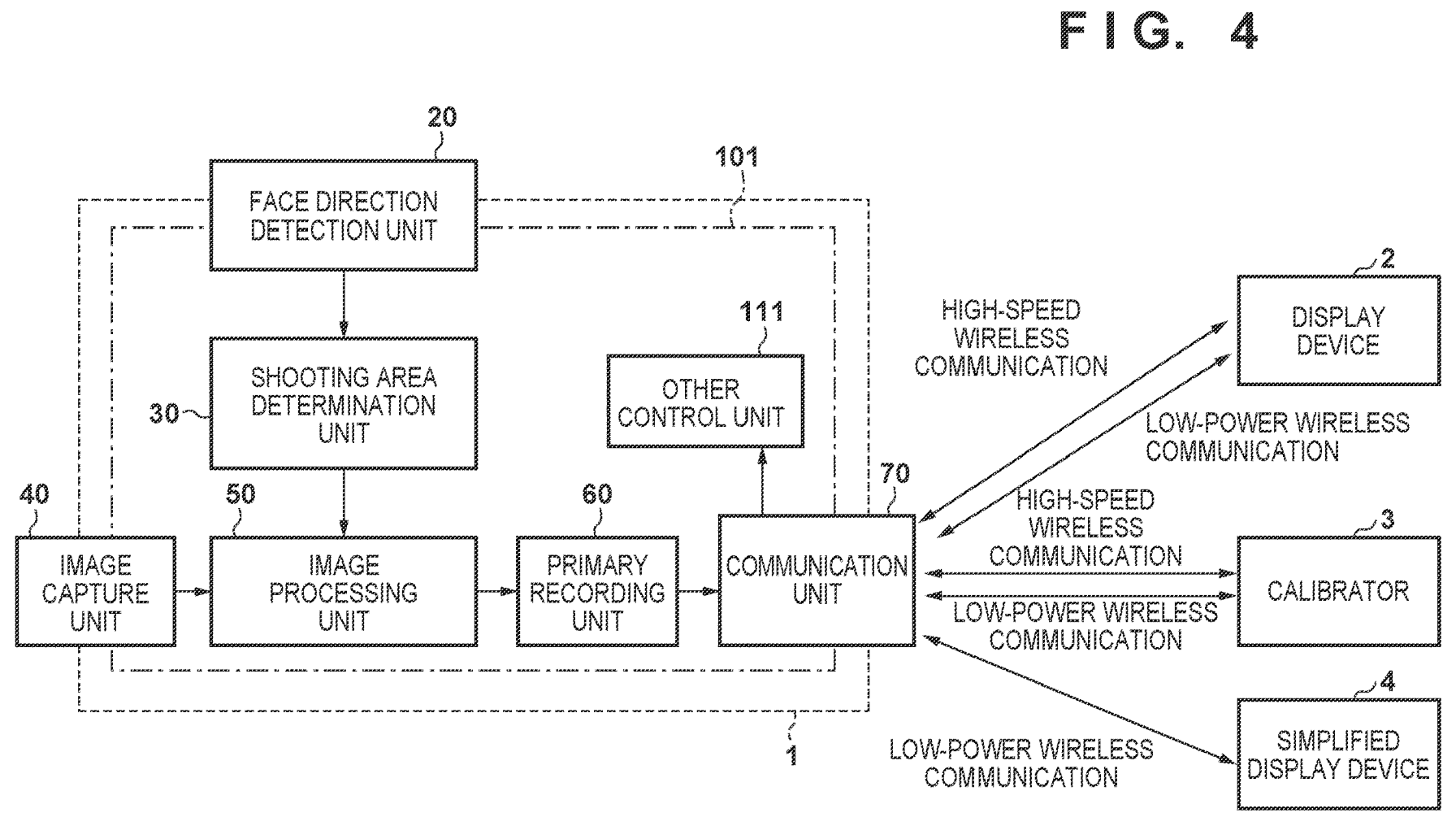

As will be described later with reference to FIG. 4, a system according to the present embodiment is constituted by at least a wearable camera 1 and a display device 2. The wearable camera 1 and the display device 2 are connected to each other so as to enable wireless communication. The wearable camera 1 can be worn on the body (for example, the neck) of the user who is a camera operator. The wearable camera 1 shoots a moving image, a still image, or the like (hereinafter, referred to as an "image") of a subject that is present in a direction in which the user is performing observation, and transmits the shot image to the display device 2. In addition, the wearable camera 1 can obtain and record sound (ambient sound) around the wearable camera 1 during shooting. In addition, the wearable camera 1 associates the recorded sound with the shot image, and transmits the associated sound and image to the display device 2. The display device 2 is a mobile communication device such as a smartphone or a tablet computer held by the user or a third party, and displays an image transmitted from the wearable camera 1, and reproduces the sound. Using the display device 2, the user can view and listen to the image shot by the camera 1 and sound recorded by the camera 1.

An example will be described in which the wearable camera 1 and the display device 2 in the system according to the present embodiment are separately configured, but may be integrally configured.

Camera Configuration

First, an external configuration of the wearable camera 1 according to the present embodiment will be described with reference to FIGS. 1A to 1C.

The wearable camera (hereinafter, a "camera") 1 includes a camera body 10, a mount portion 80, and a battery portion 90. The mount portion 80 is an necklace-type annular member for connecting the camera body 10 and the battery portion 90 to each other and wearing the camera body 10 to the neck of the user. The camera body 10 includes a face detection unit 13, a start button 14, a stop button 15, a shooting lens 16, and an indicator 17. Moreover, the camera body 10, the mount portion 80, and the battery portion 90 constitute an annular case. When the camera 1 is worn on the neck of the user, the annular case of the camera 1 is disposed so as to surround the neck of the user.

The face detection unit 13 detects position information regarding the jaw and the neck bottom of the user on which the camera 1 is worn, by irradiating, with infrared light, a lower portion (particularly, the jaw and the neck bottom) of the face of the user on which the camera 1 is worn, and capturing an image of reflected light using an infrared light image sensor built in the camera body 10.

The start button 14 is an operation member for instructing the camera 1 to start shooting of a moving image. The stop button 15 is an operation member for instructing the camera 1 to stop shooting of a moving image. The shooting lens 16 is an optical member for forming an image of a subject image using an image sensor 42 built in the camera body 10. The indicator 17 is a light emitting diode (LED) for displaying an operation state of the camera 1 by emitting light.

The mount portion 80 is provided with a plurality of microphones (hereinafter, mikes) 19LT, 19LB, 19RB, and 19RT for collecting ambient sound on the left side and the right side of the user when the camera 1 is worn on the user. The mikes 19LT and 19LB obtain sound on the left side of the user and convert the obtained sound into analog sound signals. The mikes 19RT and 19RB obtain sound on the right side of the user and convert the obtained sound into analog sound signals. The analog sound signals output from the mikes 19LT, 19LB, 19RB, and 19RT are processed by a sound processing unit 104 as will be described later with reference to FIGS. 7A and 7B. A sound signal of a left channel (Lch) that has a directivity suitable for the vicinity of the left ear of the user is then generated based on the sound signals obtained by the mikes 19LT and 19LB. In addition, a sound signal of a right channel (Rch) that has a directivity suitable for the vicinity of the right ear of the user is generated based on the sound signals obtained by the mikes 19RT and 19RB. Such the directivities are provided to the sound signals of the left and right channels by the sound processing unit 104 performing mike beam forming processing.

The mikes 19LT and 19LB are disposed on a left side surface portion of the mount portion 80 in a state where the camera 1 is being worn on the user, so as to be able to collect sound on the left side of the user who is wearing the camera 1. The mikes 19RB and 19RT are disposed on a right side surface portion of the mount portion 80 in a state where the camera 1 is being worn, so as to be able to collect sound on the right side of the user. The mike 19LT is provided at a closer position to the left ear of the user who is wearing the camera 1, than the mike 19LB is. The mike 19RT is provided at a position closer to the right ear of the user who is wearing the camera 1, than the mike 19RB is.

Hereinafter, the mikes 19LT and 19RT may also be referred to as "upper mikes", the mikes 19LB and 19RB may also be referred to as "lower mikes", the mikes 19LT and 19LB may also be referred to as "left mikes", and the mikes 19RT and 19RB may also be referred to as "right mikes". Analog sound signals output from the mikes 19LT, 19LB, 19RT and 19RB are converted into digital sound signals by the sound processing unit 104 to be described later, and the digital sound signals are subjected to mike beam forming processing, which will be described later with reference to FIGS. 7A and 7B, and are given a directivity.

Openings (sound holes) for guiding ambient sound to the respective mikes 19LT, 19LB, 19RB, and 19RT are provided in the mount portion 80. The mikes 19LT, 19LB, 19RB, and 19RT are exposed to the outside through the corresponding openings. The distance between the sound holes for the left mikes 19LT and 19LB is set to shorter than or equal to a distance that is shorter than one wavelength of the sound signal of the L channel. Also, the distance between the sound holes for the right mikes 19RT and 19RB is set to shorter than or equal to a distance that is shorter than one wavelength of the sound signal of the R channel.

Note that one of the left mikes 19LT and 19LB and the right mikes 19RB and 19RT may be disposed on a front surface portion of the camera body 10 or a rear surface portion of the battery portion 90.

FIG. 1B is a diagram showing a state where the camera 1 is worn on the neck of the user.

The mount portion 80 and the camera body 10 of the camera 1 are configured to allow the user to easily wear and remove the camera 1, due to a connection/disconnection mechanism (not illustrated) provided at two end portions of the camera body 10. In view of this, the camera 1 is worn on the neck of the user by the user hanging the mount portion 80 on the neck of the user in a state where the mount portion 80 is detached from the camera body 10, and connecting two end portions of the mount portion 80 to the two end portions of the camera body 10. The camera 1 is worn such that the battery portion 90 is positioned on the back side of the neck of the user, and the camera body 10 is positioned on the front side of the neck of the user. The camera body 10 is biased to the chest immediately under the neck of the user by the mount portion 80. Accordingly, the camera body 10 is positioned near front portions of the clavicles of the user, and the face detection unit 13 is positioned below the jaw of the user. An infrared light collecting lens 26, which will be described later with reference to FIG. 2E, is built in the face detection unit 13. The optical axis (detection optical axis) of the infrared light collecting lens 26 is directed in a direction different from the optical axis (image capture optical axis) of the shooting lens 16, and a face direction detection unit 20 to be described later detects face direction information indicating the direction of the face of the user (the angle of the face relative to the face when facing the front), and determines a direction in which the user is performing observation. Accordingly, it is possible to detect the direction in which a subject that the user is observing is present. A method for correcting a shooting direction or a shooting area based on physical differences of users and the posture of the camera 1 being worn on the user will be described later.

By disposing the camera body 10 on the front side of the neck of the user and disposing the battery portion 90 on the back side, the weight of the camera 1 can be distributed, thus relieving fatigue of the user who is wearing the camera 1, and reducing displacement of the camera 1 when the user moves.

Note that, in the present embodiment, an example is illustrated in which the camera 1 is worn such that the camera body 10 is positioned near the front portions of the clavicles of the user, but there is no limitation thereto. The camera 1 may be worn at any position of the body of the user besides the neck of the user, as long as the face direction detection unit 20 of the camera 1 can detect a direction in which the user is performing observation (hereinafter, referred to as an "observation direction") and the direction in which a subject is present can be detected.

FIG. 1C is a diagram of the battery portion 90 of the camera 1 as viewed from the rear side of FIG. 1A.

The battery portion 90 includes a charge cable connection portion 91, extension/retraction buttons 92L and 92R, and a notch portion 93.

The charge cable connection portion 91 is an adopter for connecting the camera 1 to a charge cable for connection to an external power supply (not illustrated) when charging the battery portion 90. The battery portion 90 performs charging using power supplied from the external power supply via the charge cable, and supplies the power to the camera body 10.

The extension/retraction buttons 92L and 92R are operation members for lengthening/shortening band portions 82L and 82R of the mount portion 80. The extension/retraction button 92L is capable of adjusting the length of the left band portion 82L. The extension/retraction button 92R is capable of adjusting the length of the right band portion 82R. Note that, in the present embodiment, a configuration is illustrated in which the lengths of the band portions 82L and 82R are individually adjusted using the extension/retraction buttons 92L and 92R, but a configuration may also be adopted in which the lengths of the band portions 82L and 82R can be adjusted at the same time using a single button. Hereinafter, the band portions 82L and 82R are collectively referred to as "band portions 82".

The notch portion 93 is a shape portion for avoiding abutment with the spine portion of the neck of the user such that the battery portion 90 does not interfere with the spine portion. This makes it possible to reduce uneasiness when the camera 1 is worn, and to prevent the camera 1 from moving in the left-right direction during shooting or moving.

FIG. 1D is an external view of the display device 2.

In FIG. 1D, the display device 2 includes an A button 202, a display unit 203, a B button 204, an in-camera 205, a face sensor 206, an angular velocity sensor 207, and an acceleration rate sensor 208. In addition, the display device 2 includes a communication interface (not illustrated) such as a wireless LAN interface that enables high-speed wireless communication with the camera 1.

The A button 202 is an operation member for switching on or off a power supply for the display device 2, and accepts an instruction to switch on or off the power supply when a long press is performed, and accepts an instruction to start or end other processing when a short press is performed.

The display unit 203 is a display device constituted by an LCD or organic EL display for displaying an image transmitted from the camera 1 and displaying a menu screen for performing setting of the camera 1. In the present embodiment, a touch sensor is provided integrally with the display unit 203, making it possible to accept a touch operation performed on a screen (for example, the menu screen) that is being displayed. The B button 204 is an operation member for instructing a calibrator 3, which will be described later with reference to FIG. 4, to perform calibration processing.

The in-camera 205 is capable of shooting an image of the face of the user observing the display device 2.

The face sensor 206 detects the shape and features of the face of the user who is observing the display device 2, and a direction in which the user is performing observation. The face sensor 206 can be realized by a structure light sensor, a ToF sensor, and a millimeter-wave radar, for example.

The angular velocity sensor 207 is a gyro sensor for detecting movement (rotation and direction) of the display device 2 as angular velocities in three axial directions orthogonal to one another. The acceleration rate sensor 208 detects the posture of the display device 2 by detecting the gravity direction of the display device 2. In the display device 2, calibration processing, which will be described later with reference to FIG. 4, is executed by the calibrator 3 based on detection results of the angular velocity sensor 207 and the acceleration rate sensor 208.

The display device 2 according to the present embodiment can realize the system according to the present embodiment by firmware for a smartphone or the like supporting/complying with firmware of the camera 1. Note that it is also possible to realize the system according to the present embodiment by firmware of the camera 1 supporting applications and the OS of a smartphone that serve as the display device 2.

FIGS. 2A to 2F show a configuration of the camera body 10. Hereinafter, configurations that have already been described are given the same reference signs, and a description thereof is omitted.

Figures 2A, 2B:
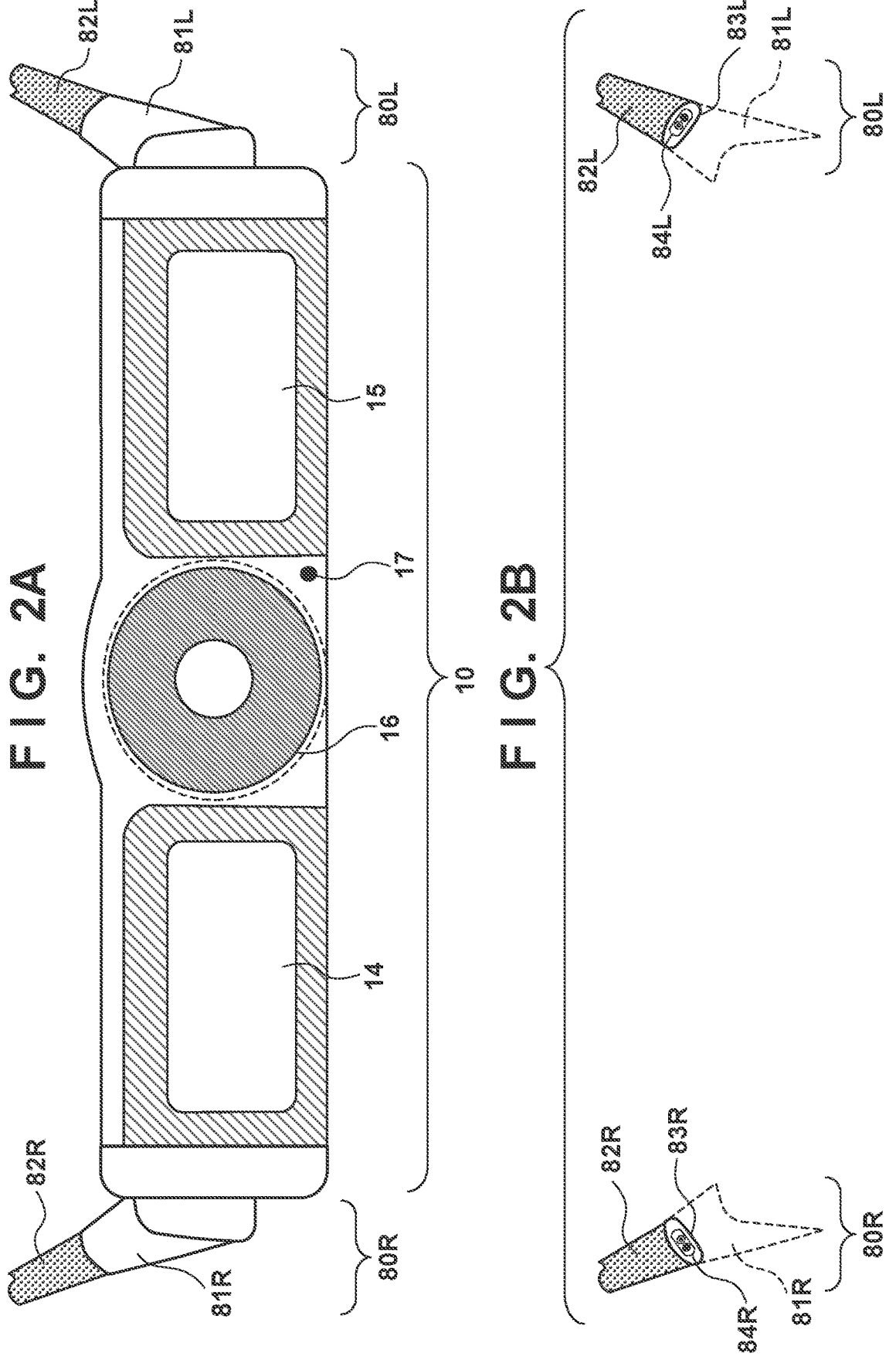
FIG. 2A is a front view of a camera body of the wearable camera according to the present embodiment.
FIG. 2B is a diagram showing the shapes of connection portions of the camera body in FIG. 2A.
Figure 2E:
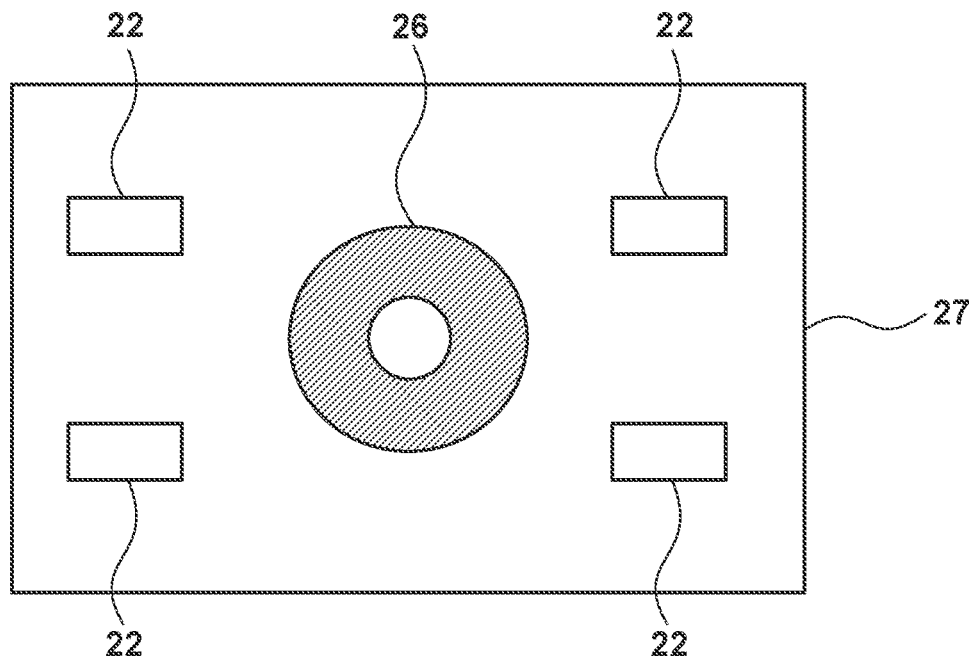
FIG. 2E is a diagram showing an internal configuration of the camera body of the wearable camera according to the present embodiment.

FIG. 2A is a front view of the camera body 10.

The mount portion 80 includes a right mount portion 80R and a left mount portion 80L. The right mount portion 80R is positioned on the right side of the body of the user, and is connected to the right end portion of the camera body 10. The left mount portion 80L is positioned on the left side of the body of the user, and is connected to the left end portion of the camera body 10. The right mount portion 80R includes an angle holding portion 81R for holding the angle between the right end portion of the camera body 10 and the right mount portion 80R, the angle holding portion 81R being made of a hard material, and a band portion 82R made of a flexible material. The left mount portion 80L includes an angle holding portion 81L for holding the angle between the left end portion of the camera body 10 and the left mount portion 80L, the angle holding portion 81L being made of a hard material, and a band portion 82L made of a flexible material.

FIG. 2B shows a configuration of the right band portion 82R of the right mount portion 80R and the left band portion 82L of the left mount portion 80L, and the angle holding portions 81R and 81L are indicated by dotted lines.

The right band portion 82R includes a right connection portion 83R and a right electric cable 84R. The left band portion 82L includes a left connection portion 83L and a left electric cable 84L. The right connection portion 83R is a connection surface between the angle holding portion 81R and the band portion 82R, and has a cross-sectional shape that is not an exact circle, and, here, the cross-section has an oblong shape. The left connection portion 83L is a connection surface between the angle holding portion 81L and the band portion 82L, and has a cross-sectional shape that is not an exact circle, and, here, the cross-section has an oblong shape. The right connection portion 83R and the left connection portion 83L have a positional relation in which the distance between the right connection portion 83R and the left connection portion 83L decreases toward the upper side of FIG. 2B. Moreover, when the user wears the camera 1 on his or her neck, the major axial directions of the connection portions 83R and 83L of the mount portions 80R and 80L extend along the body of the user. For this reason, the user feels comfortable when the band portions 82 come into contact with the body of the user, and the camera body 10 is unlikely to move in left-right direction and the front-rear direction.

The right electric cable 84R is disposed in the band portion 82R, and electrically connects the battery portion 90, the right mikes 19RT and 19RB, and the camera body 10 to one another. The left electric cable 84L is disposed in the band portion 82L, and electrically connects the battery portion 90, the left mikes 19LT and 19LB, and the camera body 10 to one another. The electric cables 84R and 84L are electric paths for supplying power of the battery portion 90 to the camera body 10, and transmitting/receiving signals to/from an external device.

FIG. 2C is a rear view of the camera body 10. FIG. 2C is a diagram of the camera body 10 as viewed from a direction in which the camera body 10 comes into contact with the neck of the user, that is to say, the direction opposite to the direction of FIG. 2A, and thus the positional relation between the right mount portion 80R and the left mount portion 80L is opposite to that in FIG. 2A. On the rear side of the camera body 10, a power button 11, a shooting mode button 12, and chest connection pads 18R and 18L are provided.

The power button 11 is an operation member for switching power-on or power-off of the camera 1. In the present embodiment, the power button 11 is a slide lever, but there is no limitation thereto. The power button 11 may also be a button to be pressed, or may also be configured integrally with a slide cover (not illustrated) of the shooting lens 16, for example.

The shooting mode button 12 is an operation member for changing the shooting mode of the camera 1. In the present embodiment, the shooting mode can be switched to one of a still image mode, a moving image mode, and a preset mode. In the present embodiment, the shooting mode button 12 is a slide lever that enables one of "Photo", "Normal", and "Pre" to be selected. The shooting mode changes to the still image mode when "Photo" is set, the shooting mode changes to the moving image mode when "Normal" is set, and the shooting mode changes to the preset mode when "Pre" is set. Note that, as long as the shooting mode button 12 is a button for enabling the shooting mode to be changed, there is no limitation to the present embodiment. Three buttons "Photo", "Normal", and "Pre" may be provided as the shooting mode button 12, for example.

When the camera body 10 is biased to the chest of the user immediately below the neck, the chest connection pads 18R and 18L abut on the neck or chest of the user. The camera body 10 has an outer shape such that the entire length in the horizontal direction (left-right direction) thereof is longer than the entire length in the vertical direction (up-down direction) thereof when the camera is worn on the neck of the user, and the chest connection pads 18 are disposed near the two end portions of the camera body 10. Accordingly, it is possible to reduce blurring due to the camera body 10 rotating in the left-right direction during shooting. In addition, the chest connection pads 18 make it possible to prevent the power button 11 and the shooting mode button 12 from coming into contact with the body of the user. Furthermore, the chest connection pads 18 have a role of preventing heat from being transmitted to the body of the user when the temperature of the camera body 10 increases due to long-time shooting, and also have a role of adjusting the angle of the camera body 10.

FIG. 2D is a top view of the camera body 10.

The face detection unit 13 is provided at a central portion of the upper surface portion of the camera body 10, and the chest connection pads 18 protrude from the two end portions of the camera body 10.

FIG. 2E shows an internal configuration of the camera body 10.

An infrared light detector 27 is disposed below the face detection unit 13. The infrared light detector 27 includes an infrared light emission unit 22 and a light collecting lens 26. Each infrared light emission unit 22 is an infrared light LED that projects infrared light 23 (see FIG. 5) toward the user via the face detection unit 13. The infrared light 23 projected from the infrared light emission unit 22 is reflected by the user, and the light collecting lens 26 forms an image from the light, namely a reflected light beam 25 (see FIG. 5), on an infrared light image sensor (light receiving element) built in the infrared light detector 27.

Figure 2F:
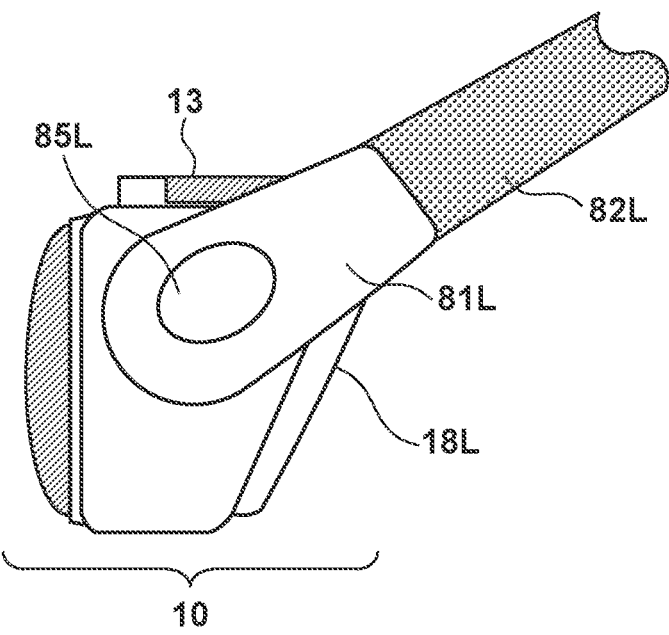
FIG. 2F is a left side view of the camera body of the wearable camera according to the present embodiment.

FIG. 2F is a left side view of the camera body 10.

A left angle adjustment button 85L is an operation member for adjusting the angle of the left angle holding portion 81L relative to the left end portion of the camera body 10. Note that, similarly, a right angle adjustment button 85R (not illustrated) for adjusting the angle of the right angle holding portion 81R relative to the right end portion of the camera body 10 is provided on a right side surface portion of the camera body 10, at a position symmetrical to the left angle adjustment button 85L. Hereinafter, the right angle holding portion 81R and the left angle holding portion 81L are collectively referred to as "angle holding portions 81". In addition, the right angle adjustment button 85R and the left angle adjustment button 85L are collectively referred to as "angle adjustment buttons 85". The angle adjustment buttons 85 are positioned so as to be viewed also in FIGS. 2A, 2C, and 2D, but, for ease of description, illustration thereof is omitted.

The user can change the angle between the camera body 10 and each angle holding portion 81 by swinging the angle holding portion 81 in the up-down direction in FIG. 2F while pressing the angle adjustment button 85. In addition, it is possible to change an angle by which the chest connection pad 18 protrudes from the camera body 10. Accordingly, the direction of the shooting lens 16 of the camera body 10 can be adjusted to the horizontal direction for the differences in shape of neck and chest between users.

FIGS. 3A to 3C show a configuration of the battery portion 90.

FIG. 3A is a rear view of the battery portion 90. Inside the battery portion 90, a left battery 94L and a right battery 94R (hereinafter, collectively referred to as "batteries 94") are disposed symmetrically relative to a center in the left-right direction. Accordingly, weight balance in the left-and-right direction of the battery portion 90 is held, and displacement of the camera 1 is reduced. Note that the battery portion 90 may be configured to be equipped with only one battery, but may also be configured to be equipped with three or more batteries.

FIG. 3B is a top view of the battery portion 90. The batteries 94 are disposed symmetrically in the left-right direction relative to the notch portion 93. Accordingly, it is possible to mount the battery portion 90 that is relatively weighty without causing any burden on the user.

FIG. 3C is a front view of the battery portion 90, and is a diagram as viewed from the opposite direction to that of FIG. 3A that shows a side of the battery portion 90 that comes into contact with the body of the user. The notch portion 93 is provided in the up-down direction in the center in the left-right direction of the battery portion 90 so as to extend along the spine of the user.

Functional Configuration of Camera

Next, a functional configuration of the camera 1 according to the present embodiment will be described with reference to FIG. 4.

The camera 1 includes the face direction detection unit 20, a shooting area determination unit 30, an image capture unit 40, an image processing unit 50, a primary recording unit 60, a communication unit 70, and other control unit 111. These are controlled by a camera control unit 101 (see FIG. 5) that performs overall processing of the camera 1.

The face direction detection unit 20 includes the infrared light emission unit 22 and the infrared light detector 27, and detects the face direction of the user in order to estimate the observation direction of the user, and outputs an estimation result to the shooting area determination unit 30 and the sound processing unit 104.

The shooting area determination unit 30 performs computation based on the observation direction of the user estimated by the face direction detection unit 20, and determines processing information indicating a position and area of an image that is extracted as an image to be recorded, from an image captured by the image capture unit 40. The determined processing information is generated and is output to the image processing unit 50.

The image capture unit 40 performs shooting of an image, generates image data, and outputs the image data to the image processing unit 50.

The image processing unit 50 extracts and develops a portion of an image captured by the image capture unit 40 based on the processing information obtained from the shooting area determination unit 30. The extracted image is output to the primary recording unit 60 as an image of the observation direction of the user.

The primary recording unit 60 includes a primary memory 103 (see FIG. 5), records the image output from the image processing unit 50, and outputs the image to the communication unit 70 at a necessary timing.

The communication unit 70 performs wireless communication with the display device 2 (see FIG. 1D), the calibrator 3, and a simplified display device 4, which are predetermined communication partners.

The display device 2 can communicate with the communication unit 70 using a wireless LAN that enables high-speed communication (hereinafter, high-speed wireless communication). In the present embodiment, a communication method that complies with the IEEE 802.11ax (WiFi (registered trademark) 6) standard is adopted for high-speed wireless communication, but a communication method that complies with another standard such as the WiFi 4 standard or the WiFi 5 standard may be also applied. In addition, the display device 2 may be a device developed specifically for the camera 1.

As a method of communication between the communication unit 70 and the display device 2, low-power wireless communication may be used, both high-speed wireless communication and low-power wireless communication may be used, or high-speed wireless communication and low-power wireless communication may be switched. In the present embodiment, a large amount of data such as a moving image to be described later is transmitted through high-speed wireless communication, and a small amount of data such as a still image and data that requires a transmission time are transmitted through low-power wireless communication. In the present embodiment, Bluetooth (registered trademark) is adopted for low-power wireless communication, but near field (short distance) wireless communication such as near field communication (NFC) may also be applied.

The calibrator 3 performs initial setting and individual setting of the camera 1, and can communicate with the communication unit 70 through high-speed wireless communication, similarly to the display device 2. Note that the display device 2 may also have the function of the calibrator 3.

The simplified display device 4 can communicate with the communication unit 70 only through low-power wireless communication. The simplified display device 4 cannot transmit/receive an image to/from the communication unit 70 due to restrictions of communication capacity, but can perform transmission of a timing signal for starting/stopping shooting, transmission of an image merely for layout check, and the like. In addition, the simplified display device 4 may be a device dedicated for the camera 1 similarly to the display device 2, or may be a smart watch or the like.

FIG. 5 is a block diagram showing a hardware configuration of the camera 1. Note that configurations that have already been described are given the same reference signs, and a description thereof is omitted. The components in FIG. 5 are included in the camera body 10. In addition, components other than the above mikes 19LT, 19LB, 19RB, and 19RT in a sound input unit 19 are included in the camera body 10.

The camera 1 includes the camera control unit 101, the power button 11, the shooting mode button 12, the face detection unit 13, the start button 14, the stop button 15, the shooting lens 16, and the indicator 17. In addition, the camera 1 includes an infrared lighting circuit 21, the infrared light emission unit 22, the infrared light collecting lens 26, and the infrared light detector 27, which constitute the face direction detection unit 20 (see FIG. 4). In addition, the camera 1 includes an image sensor drive circuit 41, the image sensor 42, and a captured image signal processing circuit 43, which constitute the image capture unit 40 (see FIG. 4). In addition, the camera 1 includes a low-power wireless communication unit 61 and a high-speed wireless communication unit 62, which constitute the communication unit 70 (see FIG. 4).

The camera 1 according to the present embodiment is provided with only one image capture unit 40, but may also be provided with two or more image capture units 40. Including a plurality of image capture units makes it possible to perform shooting of a 3D image, shooting of an image that has a wider field of view than that can be obtained by one image capture unit 40, shooting of an image in a plurality of directions, and the like.

In addition, the camera 1 includes a large capacity non-volatile memory 51, a built-in non-volatile memory 102, and the primary memory 103. Furthermore, the camera 1 includes the sound processing unit 104, a sound output unit 105, a vibration unit 106, an angular velocity sensor 107, an acceleration sensor 108, and various operating units 110.

The camera control unit 101 includes a processor such as a CPU that performs overall control of the camera 1. The functions of the shooting area determination unit 30, the image processing unit 50, and the other control unit 111 that have been described with reference to FIG. 4 are realized by the camera control unit 101 executing a program stored in the primary memory 103 or the like.

The infrared lighting circuit 21 controls on and off of the infrared light emission unit 22. The infrared light emission unit 22 emits the user with the infrared light 23. The face detection unit 13 includes a visible light cut filter, and hardly allows visible light to pass, and allows the infrared light 23 and the reflected light beam 25 to pass. The infrared light collecting lens 26 collects the reflected light beam 25.

The infrared light detector 27 includes an infrared light image sensor for detecting the reflected light beam 25 collected by the infrared light collecting lens 26. The infrared light image sensor generates image data by photoelectrically converting the reflected light beam 25 collected by the infrared light collecting lens 26 and formed into an image by the infrared light image sensor, and outputs the generated image data to the camera control unit 101.

As shown in FIG. 1B, in a state where the user is wearing the camera 1, the face detection unit 13 is positioned below the jaw of the user. For this reason, the infrared light 23 projected from the infrared light emission unit 22 passes through the face detection unit 13, and an infrared light emission surface 24, which is a surface of skin in the vicinity of the jaw of the user, is emitted with the infrared light 23. The infrared light 23 reflected by the infrared light emission surface 24 passes through the face detection unit 13 as the reflected light beam 25, and is formed into an image on the infrared light image sensor of the infrared light detector 27 through the infrared light collecting lens 26.

The various operating units 110 are operation members for executing functions other than the afore-mentioned functions of the camera 1.

The image sensor drive circuit 41 includes a timing generation circuit and the like, and generates a timing signal for controlling an image capture operation that is performed by the image sensor 42. The image sensor 42 generates captured image signals by photoelectrically converting a subject image formed by the shooting lens 16 shown in FIG. 1A, and outputs the generated signals to the captured image signal processing circuit 43. The captured image signal processing circuit 43 generates image data by performing clamp processing, A/D conversion processing, and the like on the captured image signals from the image sensor 42, and outputs the generated image data to the camera control unit 101.

The built-in non-volatile memory 102 is a flash memory or the like, and stores a program to be executed by the camera control unit 101, constants and variables for executing the program, and the like. The camera 1 according to the present embodiment can change the shooting field of view (shooting area) and set the intensity of anti-vibration control, and thus setting values thereof are also stored in the built-in non-volatile memory 102.

The primary memory 103 is a RAM or the like, and temporarily stores image data that is being processed, or temporarily stores a result of computation performed by the camera control unit 101. Processed image data is written as a moving image file or a still image file to the large capacity non-volatile memory 51, and such a file is read out from the large capacity non-volatile memory 51. The large capacity non-volatile memory 51 may be a recording medium built in the camera body 10, or may be a removable recording medium such as a memory card, or may be used along with the built-in non-volatile memory 102.

The low-power wireless communication unit 61 performs data communication with the display device 2, the calibrator 3, and the simplified display device 4 through low-power wireless communication. The high-speed wireless communication unit 62 performs data communication with the display device 2, the calibrator 3, and the simplified display device 4 through high-speed wireless communication.

The sound input unit 19 that includes a plurality of mikes 19LT, 19LB, 19RB, and 19RT is connected to the sound processing unit 104. The sound processing unit 104 generates digital sound signals by sampling analog sound signals output from the mikes, for each predetermined period.

The indicator 17, the sound output unit 105, and the vibration unit 106 notify the user of the state of the camera 1 or issue an alert by emitting light, generating sound, and vibrating.

The angular velocity sensor 107 detects movement (rotation and direction) of the camera body 10. The acceleration sensor 108 detects posture information of the camera body 10. The posture information of the camera body 10 is, for example, inclination of the shooting optical axis of the camera body 10 (upper, lower, left, and right angles). Note that the angular velocity sensor 107 and the acceleration sensor 108 are built in the camera body 10, and the angular velocity sensor 207 and the acceleration rate sensor 208 are provided in the display device 2.

Configuration of Display Device

FIG. 6 is a block diagram showing a hardware configuration of the display device 2. Note that configurations that have already been described are given the same reference signs, and a description thereof is omitted.

The display device 2 includes a display device control unit 201, the A button 202, the display unit 203, the B button 204, the in-camera 205, the face sensor 206, the angular velocity sensor 207, the acceleration rate sensor 208, a captured image signal processing circuit 209, and various operation units 211.

In addition, the display device 2 includes a built-in non-volatile memory 212, a primary memory 213, a large capacity non-volatile memory 214, a sound output unit 215, a vibration unit 216, an indicator 217, a sound processing unit 220, a low-power wireless communication unit 231, and a high-speed wireless communication unit 232.

The display device control unit 201 includes a processor such as a CPU that performs overall control of the display device 2.

The captured image signal processing circuit 209 has functions similar to those of the image sensor drive circuit 41, the image sensor 42, and the captured image signal processing circuit 43 of the camera 1, and such functions are collectively shown in FIG. 6. Data output from the captured image signal processing circuit 209 is processed by the display device control unit 201.

The various operation units 211 are operation members for executing functions other than the aforementioned functions of the display device 2.

The angular velocity sensor 207 detects movement of display device 2. The acceleration rate sensor 208 detects the posture of the display device 2.

Note that the angular velocity sensor 207 and the acceleration rate sensor 208 are built in the display device 2, and have functions similar to those of the angular velocity sensor 107 and the acceleration sensor 108 built in the camera 1.

The built-in non-volatile memory 212 is a flash memory or the like, and stores a program to be executed by the display device control unit 201, and constants and variables for executing the program, and the like.

The primary memory 213 is a RAM or the like, and temporarily stores image data that is being processed, and temporarily stores a result of computation performed by the display device control unit 201. In the present embodiment, during moving image shooting, data detected by the angular velocity sensor 107 at the shooting time of each frame is associated with the frame, and is held in the primary memory 213.

Processed image data and image data transmitted from the camera 1 are written as a moving image file or a still image file to the large capacity non-volatile memory 214, and such a file is read out from the large capacity non-volatile memory 214. The large capacity non-volatile memory 214 may be a recording medium built in the display device 2, or may be a removable recording medium such as a memory card, or may be used along with the built-in non-volatile memory 212.

The sound output unit 215, the vibration unit 216, and the indicator 217 notify the user of the state of the display device 2 or issue an alert by generating sound, vibrating, and emitting light.

The sound processing unit 220 is connected to a sound input unit 219 that includes a plurality of mikes 219L and 219R for collecting sound in the surroundings of the display device 2, and generates digital sound signals by sampling analog sound signals output from the mikes.

The low-power wireless communication unit 231 performs data communication with the camera 1 through low-power wireless communication. The high-speed wireless communication unit 232 performs data communication with the camera 1 through high-speed wireless communication.

The face sensor 206 includes an infrared lighting circuit 221, an infrared light emission unit 222, an infrared light collecting lens 226, and an infrared light detector 227.

The infrared lighting circuit 221 controls on and off of the infrared light emission unit 222. The infrared light emission unit 222 emits the user with infrared light 223. The infrared light collecting lens 226 collects a reflected light beam 225. The infrared light detector 227 includes an infrared light image sensor for detecting the reflected light beam 225 collected by the infrared light collecting lens 226. The infrared light image sensor generates image data by photo-electrically converting the reflected light beam 225 collected by the infrared light collecting lens 226 and formed into an image by the infrared light image sensor, and outputs the generated image data to the display device control unit 201.

When the face sensor 206 is directed to the user, an infrared light emission surface 224, which is the entire face of the user, is emitted with the infrared light 223 projected from the infrared light emission unit 222 as shown in FIG. 6. The infrared light 223 reflected by the infrared light emission surface 224, that is to say, the reflected light beam 225 is formed into an image on the infrared light image sensor of the infrared light detector 227 through the infrared light collecting lens 226.

Another function unit 230 executes a telephone function, other functions, and the like, other than the afore-mentioned functions of the display device 2.

Configuration of Sound Processing Unit

Next, a configuration and functions of the sound processing unit 104 of the camera 1 according to the present embodiment will be described with reference to FIGS. 7A and 7B.

FIG. 7A is a block diagram showing a configuration of the sound processing unit 104 of the camera 1 according to the present embodiment. FIG. 7B is a block diagram showing a configuration of a beam forming unit of the sound processing unit 104 in FIG. 7A.

The sound processing unit 104 includes an Lch A/D converter 121L, an Rch A/D converter 121R, a signal processing unit 122, and an ALC unit 123. In addition, the signal processing unit 122 includes an Lch beam forming unit 122L and an Rch beam forming unit 122R. The sound input unit 19 includes the mikes 19LT, 19LB, 19RB, and 19RT.

The Lch A/D converter 121L converts sound signals for the left ear (L1 and L2 channels) obtained by the left mikes 19LT and 19LB, from analog sound signals into digital sound signals. The Rch A/D converter 121R converts sound signals for the right ear (R1 and R2 channels) obtained by the right mikes 19RT and 19RB, from analog sound signals into digital sound signals. In A/D conversion processing that is performed by the Lch A/D converter 121L and the Rch A/D converter 121R, processing for multiplying each sound signal by a predetermined gain is performed so as to obtain a desired signal level in accordance with the sensitivity of the mike. A programable gain amplifier (PGA) is used as a method for multiplying a signal by a gain, for example. In addition, various methods are used for A/D conversion, but delta-sigma A/D conversion is mainly used for sound signals.

The signal processing unit 122 executes gain adjustment, filter processing such as removal of low frequency components or removal of high frequency components, and beam forming processing on sound signals of L1, L2, R1, and R2 channels subjected to A/D conversion processing, and generates sound signals of two types of channels, namely left and right channels. The Lch beam forming unit 122L performs beam forming processing on the sound signals of the L1 and L2 channels. The Rch beam forming unit 122R performs beam forming processing on the sound signals of the R1 and R2 channels. Beam forming processing will be described in detail later with reference to FIG. 7B.

The auto level control (ALC) unit 123 adjusts the levels of the sound signals of the L channels and the sound signals of the R channels subjected to beam forming processing, so as to achieve appropriate volume, and outputs the sound signals to the primary memory 103. Sound data obtained by performing predetermined sound processing on sound signals obtained by the mikes during moving image shooting performed by the camera 1 is stored in the primary memory 103 in association with moving image data, and the sound data and the moving image data are stored in the large capacity non-volatile memory 51 as a moving image file and a sound file.

FIG. 7B is a block diagram showing a configuration of the Lch beam forming unit 122L and the Rch beam forming unit 122R in FIG. 7A.

The Lch beam forming unit 122L and the Rch beam forming unit 122R provide a directivity to the sound signals of the L channels and the sound signals of the R channels by correcting the phase delay time of the sound signal obtained by the upper mike 19LT or the upper mike 19RT by multiplying the phase delay time by a gain, based on information regarding the distance between the camera body 10 and the face of the user detected by the face direction detection unit 20 (chin distance to be described later with reference to FIGS. 9A to 9C) and information regarding the posture (upper, lower, left, and right angles) of the camera 1 detected by the acceleration sensor 108. A delay sum method is used for beam forming processing, and, for example, a phase change filter of a delay time that is based on the angle of the camera 1 for which sound is desired to be emphasized is applied to the sound signal obtained by the upper mike 19LT or the upper mike 19RT, the sound signal obtained by the lower mike 19LB or lower mike 19RB is then added, and sound arriving from the camera 1 at the angle for which sound is desired to be emphasized is intensified, whereby a sound signal that has a desired directivity is generated.

The Lch beam forming unit 122L and the Rch beam forming unit 122R each include a signal delay unit 124 and an amplification unit 125. The signal delay unit 124 applies, to the sound signals obtained by the upper mike 19LT and the upper mike 19RT, a phase change filter of a delay time that is based on the posture of the camera 1 detected by the acceleration sensor 108. In the present embodiment, the delay time corresponds to one sample period by which the sound signals of the upper mikes 19LT and 19RT are delayed relative to the sound signals of the lower mikes 19LB and 19RB. The amplification unit 125 corrects the delay time that is applied by the signal delay unit 124, by multiplying the delay time by a predetermined gain, in accordance with the spaced distance between the camera body 10 and the face of the user detected by the face direction detection unit 20.

Control Processing

Control processing of the camera 1 and the display device 2 will be described below.

FIG. 8A is a flowchart showing control processing of the camera 1 and the display device 2 according to the present embodiment.

The processing of the camera 1 in FIG. 8A is realized by switching on the power supply of the camera 1, the camera control unit 101 loading a program stored in the built-in non-volatile memory 102 to the primary memory 103, and executing the program, and thereby controlling components of the camera 1. In addition, the processing of the display device 2 in FIG. 8A is started when the power supply of the display device 2 is switched on and the camera 1 is worn on the user, and is realized by the display device control unit 201 loading a program stored in the built-in non-volatile memory 212 to the primary memory 213, and executing the program, and thereby controlling components of the display device 2.

Note that steps S100 to S700 in FIG. 8A are processing that is executed by the camera 1. Steps S800 to S1000 in FIG. 8A are processing that is executed by the display device 2.

In step S100, when the power button 11 is switched on, and the camera 1 is powered on, the camera control unit 101 is started. The camera control unit 101 reads out a program from the built-in non-volatile memory 102, and executes shooting preparation processing for performing shooting setting of the camera 1. The shooting preparation processing will be described later in detail with reference to FIG. 8B.

In step S200, the face direction detection unit 20 estimates a direction in which the user is performing observation. Face direction detection processing will be described later in detail with reference to FIG. 8C.

In step S300, the shooting area determination unit 30 determines a shooting direction and a shooting field of view of the camera 1. Note that the face direction detection processing in step S200 and the shooting area determination processing in step S300 are repeatedly executed in a state where the power supply of the camera 1 is on. In addition, a configuration may also be adopted in which, during a period from when the image capture unit 40 starts shooting in accordance with an operation performed on the start button 14 until when shooting is stopped in accordance with an operation performed on the stop button 15, the processing of step S200 and the processing of step S300 are repeatedly performed, and, during a period other than that, the processing of step S200 and the processing of step S300 are not performed.

In step S400, the image capture unit 40 performs shooting of an image in accordance with the user giving an instruction to start shooting, and generates image data. Shooting processing will be described later in detail with reference to FIG. 8D.

In step S500, the image processing unit 50 extracts an image from the image data generated in step S400 and develops the extracted area, based on the shooting direction and the shooting field of view determined in step S300.

In step S600, the primary recording unit 60 stores the image data developed in step S500 in the primary memory 103.

In step S700, the communication unit 70 transmits the image data stored in the primary memory 103 in step S600, to the display device 2 at a predetermined timing.

In step S800, the display device control unit 201 performs optical correction on the image data transmitted from the camera 1 in step S700.

In step S900, the display device control unit 201 performs anti-vibration processing on the image data subjected to the optical correction executed in step S800.

Note that the order of the processing of step S800 and the processing of step S900 may be reversed. In other words, optical correction may be performed after anti-vibration processing of image data is performed.

In step S1000, the display device control unit 201 stores the image data subjected to the optical correction in step S800 and the anti-vibration processing in step S900, in the large capacity non-volatile memory 214 (secondary recording).

Preparation Processing

FIG. 8B is a flowchart showing shooting preparation processing of step S100 in FIG. 8A.

In step S101, the camera control unit 101 determines whether or not the power button 11 is on. The camera control unit 101 waits when the power supply is off, and advances the procedure to step S102 when it is determined that the power supply has been switched on.

In step S102, the camera control unit 101 determines an operation mode selected using the shooting mode button 12. When it is determined that the operation mode is a moving image mode, the camera control unit 101 advances the procedure to step S103. When it is determined that the operation mode is a still image mode, the camera control unit 101 advances the procedure to step S106. When it is determined that the operation mode is a preset mode, the camera control unit 101 advances the procedure to step S108.

In step S103, the camera control unit 101 reads out settings of the moving image mode from the built-in non-volatile memory 102, and stores the settings in the primary memory 103. The settings of the moving image mode include, for example, a field-of-view setting value ang (which is set to 90° as an initial value in advance in the present embodiment) and an anti-vibration level designated as "high", "moderate", "off", or the like.

In step S104, the camera control unit 101 causes the image sensor drive circuit 41 to start operating for the moving image mode.

In step S106, the camera control unit 101 reads out settings of the still image mode from the built-in non-volatile memory 102, and stores the settings in the primary memory 103. The settings of the still image mode include, for example, a field-of-view setting value ang (which is set to 45° as an initial value in advance in the present embodiment) and an anti-vibration level designated as "high", "moderate", "off", or the like.

In step S107, the camera control unit 101 causes the image sensor drive circuit 41 to start operating for the still image mode.

In step S108, the camera control unit 101 reads out settings of the preset mode from the built-in non-volatile memory 102, and stores the settings in the primary memory 103. The preset mode is a custom shooting mode in which an external device such as the display device 2 changes the settings of the camera 1. The camera 1 is a small-sized wearable device, and is not provided with an operation member for performing detailed settings or a display unit for displaying a menu screen and the like, and thus the external device such as the display device 2 changes the settings of the camera 1.

A case is envisioned in which, for example, it is desirable to perform shooting with a field of view of 90° and a field of view of 110° in a row during moving image shooting. The field of view of 90° is set for a normal moving image mode, and thus, in order to change the field of view and perform shooting, there is a need to perform an operation of, first, performing shooting in the normal moving image mode, then ending shooting, displaying a setting screen of the camera 1 on the display device 2, and changing the field of view to 110°. In this case, when the display device 2 is performing some form of event such as when the display device 2 is on the phone, an operation of changing settings that is performed by the display device 2 becomes complicated.

In contrast, in the preset mode, when the field of view is set to 110° in advance, the field of view is immediately changed to 110° merely by setting the shooting mode button 12 to "Pre" after moving image shooting has ended with the field of view of 90°, and moving image shooting can be continued. In this manner, the user can change the settings of the moving image mode without suspending the current mode and performing a complicated operation.

Note that the settings of the preset mode may include not only the field of view, but also an anti-vibration level that is designated as "high", "moderate", "off", or the like, settings of voice recognition, and the like.

In step S109, the camera control unit 101 causes the image sensor drive circuit 41 to start operating for the preset mode.

Face Direction Detection Processing

Figure 8C:
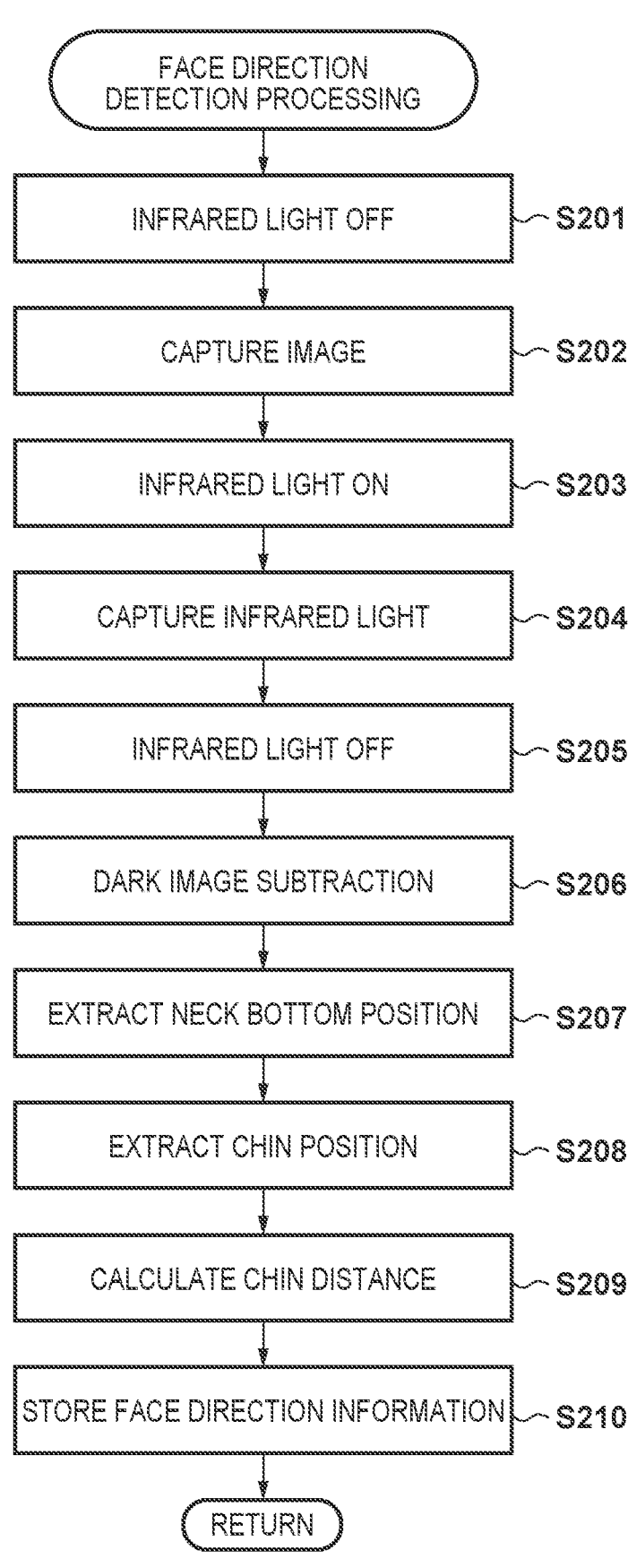
FIG. 8C is a flowchart showing the face direction detection processing in FIG. 8A.

FIG. 8C is a flowchart showing face direction detection processing of step S200 in FIG. 8A.

First, a face direction detection method that is performed by the face direction detection unit 20 according to the present embodiment will be described with reference to FIGS. 9A to 9C.

Figure 9A:
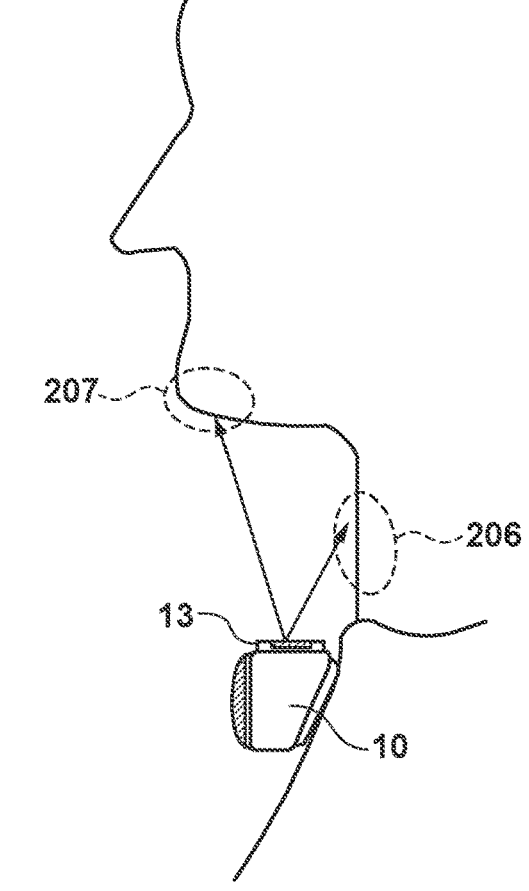
FIG. 9A is a diagram illustrating a face direction detection method of the wearable camera according to the present embodiment.

As shown in FIG. 9A, in a state where the user is wearing the camera 1, the face detection unit 13 is disposed immediately below the jaw of the user. The infrared light emission unit 22 of the face direction detection unit 20 emits a bottom of the jaw with infrared light through the face detection unit 13, and the infrared light detector 27 captures an infrared light image of an area extending from the jaw of the face to the neck bottom. The face direction detection unit 20 then executes binarization and edge extraction of the infrared light image.

Figure 9B:
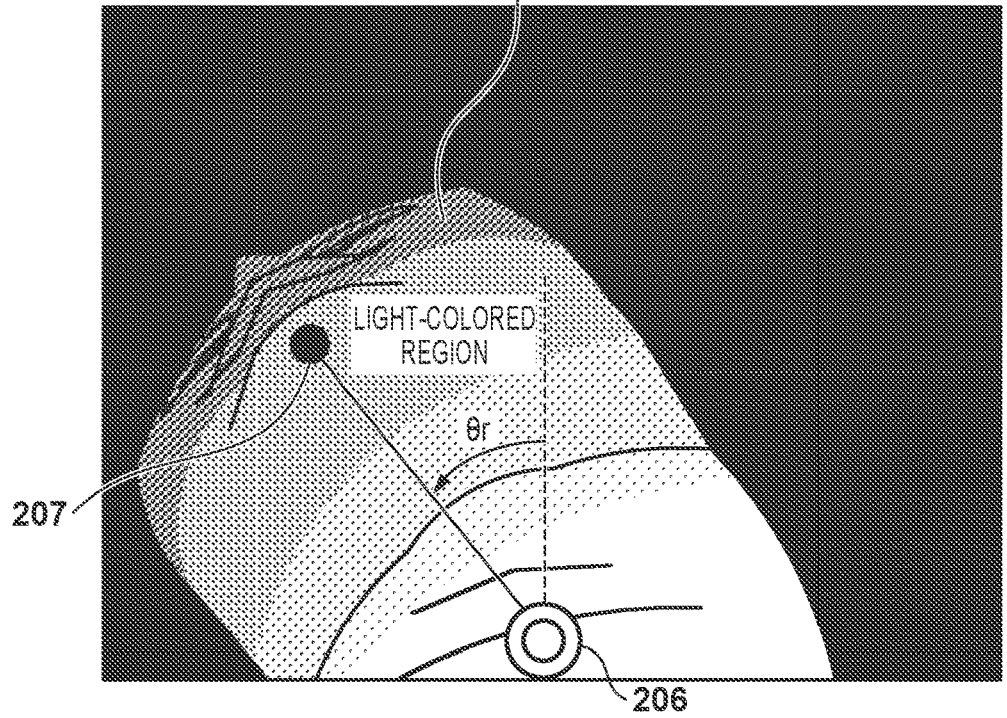
FIG. 9B is a diagram illustrating the face direction detection method of the wearable camera according to the present embodiment.

As shown in FIG. 9B, the face direction detection unit 20 sets, as a chin position 207, the position of a dark-colored portion of a binary image that corresponds to a protrusion of an edge, and sets, as a neck bottom position 206, the position of a light-colored portion that is close to a central portion of a lower surface of the face detection unit 13. Furthermore, the face direction detection unit 20 calculates the distance between the neck bottom position 206 and the chin position 207, and calculates a first face direction θh of the user based on the amount of time-series displacement of the chin position 207. The first face direction θh is information indicating the direction of the face of the user when the user turns his or her neck to the left or right, assuming that a state where the user faces the front in a state where the user is wearing the camera 1 is set to 0°.

Figures 9C, 10:
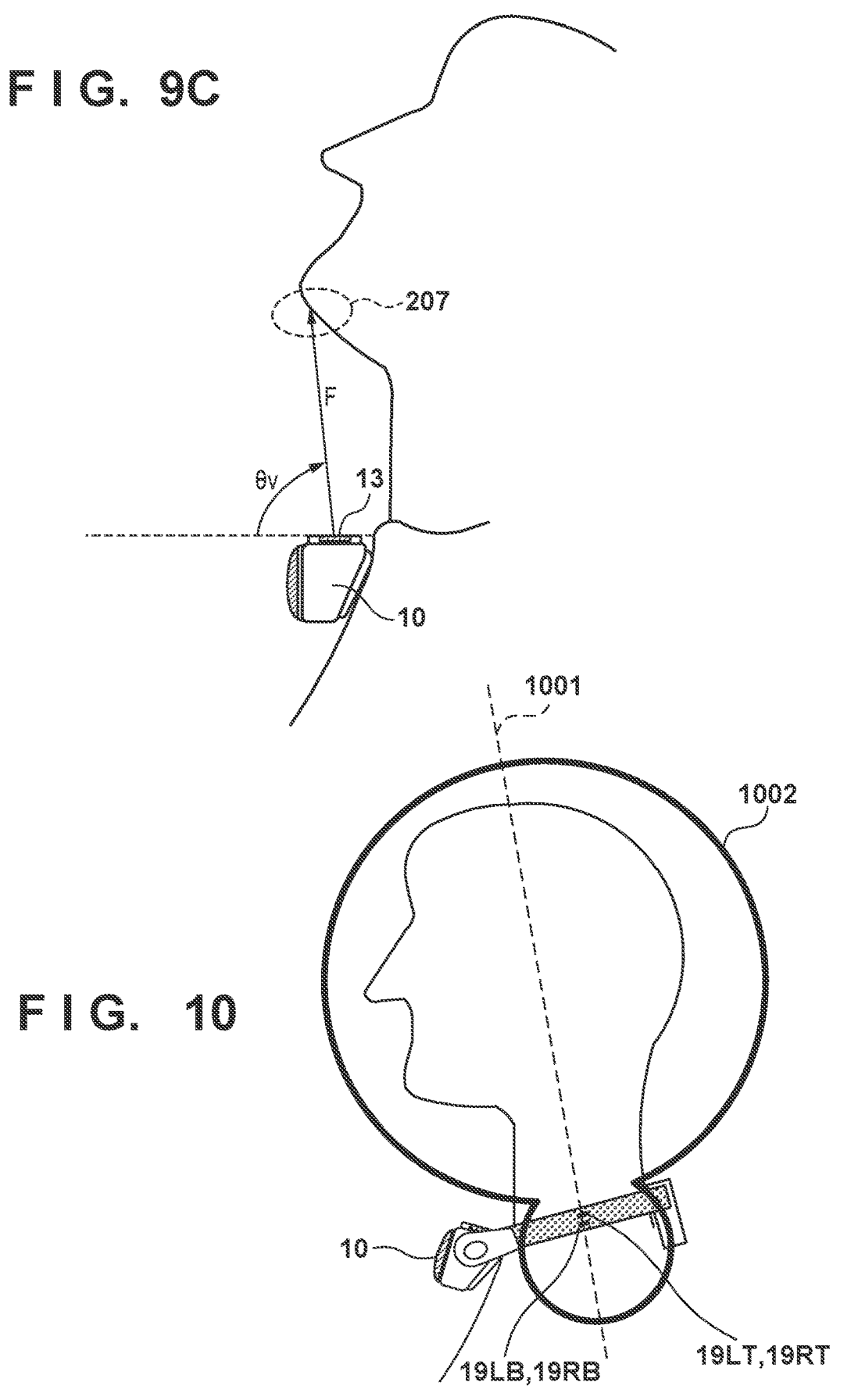

Furthermore, the face direction detection unit 20 calculates distribution ratios of regions ranging from a dark-colored region to a light-colored region in the area extending from the neck bottom position 206 to the chin position 207, and calculates a chin distance F between the face detection unit 13 and the chin position 207 as shown in FIG. 9C. In addition, the face direction detection unit 20 calculates a second face direction θv of the user based on the amount of time-series change of the chin distance F. The second face direction θv is information indicating the direction of the face of the user when the user bends his or her neck forward or backward, assuming that a state where the user faces the front in a state where the user is wearing the camera 1 is set to 0°.

The face direction detection processing of step S200 in FIG. 8A that is performed using the face direction detection method described with reference to FIGS. 9A to 9C will be described later with reference to FIG. 8C.

In step S201, the face direction detection unit 20 outputs a control signal to the infrared lighting circuit 21 at time t1, so as to stop emission from the infrared light emission unit 22.

In step S202, the infrared light detector 27 of the face direction detection unit 20 captures an image. The face direction detection unit 20 reads out captured image data of one frame from the infrared light detector 27, and stores the image data as Frame 1 in the primary memory 103.

In step S203, the infrared light emission unit 22 of the face direction detection unit 20 emits a bottom of the jaw of the user with infrared light through the face detection unit 13 at time t2.

In step S204, the infrared light detector 27 of the face direction detection unit 20 captures an infrared light image of an area extending from the jaw of the face of the user to the neck bottom at time t2. The face direction detection unit 20 reads out captured image data of one frame from the infrared light detector 27, and stores the image data as Frame 2, in the primary memory 103.

In step S205, the face direction detection unit 20 outputs a control signal to the infrared lighting circuit 21, so as to stop emission from the infrared light emission unit 22.

In step S206, the face direction detection unit 20 reads out Frame 1 and Frame 2 from the primary memory 103, and calculates a light intensity Fn of the reflected light beam 25 based on the difference between Frame 2 and Frame 1 (dark subtraction processing).

In step S207, the face direction detection unit 20 extracts a neck bottom position (neck rotation center) based on the light intensity Fn calculated in step S206.

In step S208, the face direction detection unit 20 extracts the chin position 207 and the neck bottom position 206 from the light intensity Fn calculated in step S206. Furthermore, the face direction detection unit 20 calculates the distance between the neck bottom position 206 and the chin position 207, and calculates the first face direction θh of the user based on the amount of time-series displacement of the chin position 207.

In step S209, the face direction detection unit 20 calculates the chin distance F between the face detection unit 13 and the chin position 207 based on the light intensity Fn calculated in step S206 and the neck bottom position 206 and the chin position 207 extracted in step S208. In addition, the face direction detection unit 20 calculates the second face direction θv of the user based on the amount of time-series change in the chin distance F.

In step S210, the face direction detection unit 20 stores, in the primary memory 103, the first face direction θh and the second face direction θv respectively calculated in steps S208 and S209, as an observation direction v of the user. An observation direction vo when the user is performing observation at the center on the front, for example, is vector information [0°, 0°] since the first face direction θh is 0° and the second face direction θv is 0°. In addition, an observation direction vr when the user is performing observation at a right angle of 45° is vector information [45°, 0°].

Shooting Processing and Recording Processing

Next, recording processing in the shooting processing of step S400 in FIG. 8A will be described with reference to FIGS. 8D and 10.

FIG. 8D is a flowchart showing recording processing in the shooting processing of step S400 in FIG. 8A. FIG. 10 is a diagram illustrating the recording processing in the shooting processing that is performed by the camera 1 according to the present embodiment. The processing in FIG. 8D is repeatedly executed while the shooting processing is being executed.

In the present embodiment, let us assume that, as shown in FIG. 10, there is a point sound source at a distant position on a line 1001 that connects the left mikes 19LT and 19LB aligned in the up-down direction (the same applies to the right mikes 19RT and 19RB). Then, a delay time that occurs when acoustic waves are transmitted is corrected by performing beam forming processing based on sound pressure obtained by the upper and lower mikes, and a directivity is provided to the sound signals so as to emphasize a sound field near the ear of the user by emphasizing acoustic waves arriving from the direction of the point sound source. Accordingly, a sound collection area 1002 of the left mikes 19LT and 19LB can be brought close to the ear of the user as with an earphone equipped with a mike (the same applies to the right mikes 19RT and 19RB), thus enabling binaural recording that does not give a feeling that something is amiss.

In step S401, the camera control unit 101 initializes the sound input unit 19. The sound processing unit 104 starts to energize the mikes 19LT, 19LB, 19RT, and 19RB, inputs a clock signal, and prepares for obtaining sound signals from the respective mikes.

In step S402, the camera control unit 101 initializes the sound processing unit 104. Regarding the sound processing unit 104, a gain of A/D conversion processing and the like are initialized. In addition, effects of gain correction of sound signals through beam forming processing described with reference to FIGS. 7A and 7B change according to physical differences of users and the posture of the camera 1 being worn on the user. For this reason, initial values (thresholds) are set for the chin distance for determining physical differences of the user and upper, lower, left, and right angles of the camera 1 for determining the posture of the camera 1 being worn on the user, and phase delay times of the upper mikes 19LT and 19RT are set to the initial values.

In step S403, the camera control unit 101 reads out the chin distance F obtained in step S210 in FIG. 8C, from the primary memory 103.

In step S404, the camera control unit 101 compares the chin distance F read out in step S403 with the initial value (threshold) of the chin distance. When it is determined that the chin distance F is longer than the threshold, the camera control unit 101 advances the procedure to step S405. When it is determined that the chin distance F is shorter than or equal to the threshold, the camera control unit 101 advances the procedure to step S406.

In step S405, the camera control unit 101 increases the gain of the amplification unit 125 so as to increase a phase delay time caused by beam forming processing performed on the sound signals of the upper mikes 19LT and 19RT, and performs correction by multiplying the phase delay time of the signal delay unit 124 by the gain. The phase delay time is determined using the chin distance F based on 1/F×100, assuming that the initial value of the chin distance is 1.

In step S406, the camera control unit 101 decreases the gain of the amplification unit 125 so as to decrease a phase delay time caused by beam forming processing performed on the sound signals of the upper mikes 19LT and 19RT, and performs correction by multiplying the phase delay time of the signal delay unit 124 by the gain.

In step S407, the camera control unit 101 executes recording processing of the sound signals subjected to beam forming processing performed by the sound processing unit 104. The camera control unit 101 causes the image capture unit 40 to start shooting processing in accordance with an operation performed on the start button 14, and to stop shooting processing in accordance with an operation performed on the stop button 15.

As described above, according to the present embodiment, the effect of binaural recording is achieved irrespective of a change in the position of an ear of the user and a change in the position of a mike.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-021864, filed Feb. 15, 2023 which is hereby incorporated by reference herein in its entirety.

What is claimed is:

1. An image capture apparatus that is wearable on a neck of a user, comprising:
an image capture circuit;
a mount portion that is disposed so as to surround the neck of the user when the image capture apparatus is worn on the user;
a first microphone, a second microphone, a third microphone, and a fourth microphone provided on the mount portion,
the first microphone and the second microphone being provided at positions for collecting sound on a left side of the user who is wearing the image capture apparatus, the first microphone being provided at a position closer to the left ear of the user who is wearing the image capture apparatus than the second microphone is, the third microphone and the fourth microphone being provided at positions for collecting sound on a right side of the user who is wearing the image capture apparatus, and the third microphone being provided at a position closer to the right ear of the user who is wearing the image capture apparatus than the fourth microphone is;
a CPU; and
a memory that stores a program for causing, when executed by the CPU, the CPU to function as:
a sound processing unit that generates a first sound signal having a directivity for the left ear of the user, based on sound signals obtained by the first microphone and the second microphone, and that generates a second sound signal having a directivity for the right ear of the user, based on sound signals obtained by the third microphone and the fourth microphone,
wherein the sound processing unit performs processing for delaying a phase of the sound signal obtained by the first microphone or the third microphone, relative to the sound signal obtained by the second microphone or the fourth microphone, and generates the first sound signal and the second sound signal by correcting a delay time of the sound signal obtained by the first microphone or the third microphone, by multiplying the delay time by a gain.

2. The apparatus according to claim 1, wherein the program, when executed by the CPU, further cause the CPU to function as:
a face direction detection unit that detects a direction in which a user wearing the image capture apparatus is observing,
wherein the face direction detection unit obtains a distance between a first portion and a second portion of the face of the user, and
the sound processing unit corrects the gain based on the distance.

3. The apparatus according to claim 2, wherein the program, when executed by the CPU, further cause the CPU to function as:

an infrared light emission unit that emits a lower portion of the face of the user with infrared light; and an infrared light detection unit that detects reflected light of the infrared light, wherein the face direction detection unit obtains a distribution of distance based on the reflected light detected by the infrared light detection unit, and detects a direction in which the user is performing observation based on the distribution of distance.

4. The apparatus according to claim 2, wherein the sound processing unit includes:

a first sound processing unit that generates the first sound signal, and a second sound processing unit that generates the second sound signal, wherein the first sound processing unit changes a gain of the sound signal obtained by the first microphone, based on the distance, and the second sound processing unit changes a gain of the sound signal obtained by the third microphone, based on the distance.

5. The apparatus according to claim 4, wherein the first sound processing unit and the second sound processing unit:

change the gain such that the delay time increases when the distance is longer than a threshold, and change the gain such that the delay time decreases when the distance is shorter than or equal to the threshold.

6. The apparatus according to claim 2, wherein the distance is a distance between the face direction detection unit and a chin of the user who is wearing the image capture apparatus.

7. The apparatus according to claim 1, wherein the mount portion is provided with a plurality of holes for guiding ambient sound to the first microphone, the second microphone, the third microphone, and the fourth microphone, respectively, a distance between the hole for the first microphone and the hole for the second microphone is set to a predetermined distance or shorter, a distance between the hole for the third microphone and the hole for the fourth microphone is set to the predetermined distance or shorter, and the predetermined distances respectively correspond to a distance shorter than one wavelength of the first sound signal and a distance shorter than one wavelength of the second sound signal.

* * * * *